(12) United States Patent
Sakata et al.

(10) Patent No.: US 12,207,557 B2
(45) Date of Patent: Jan. 21, 2025

(54) METHOD FOR MANUFACTURING VIBRATOR DEVICE

(71) Applicant: SEIKO EPSON CORPORATION, Tokyo (JP)

(72) Inventors: Hiyori Sakata, Minowa-machi (JP); Ryuta Nishizawa, Nagano (JP); Shigeru Shiraishi, Ina (JP); Keiichi Yamaguchi, Ina (JP); Takuro Kobayashi, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 419 days.

(21) Appl. No.: 17/865,052

(22) Filed: Jul. 14, 2022

(65) Prior Publication Data
US 2023/0020694 A1  Jan. 19, 2023

(30) Foreign Application Priority Data
Jul. 16, 2021  (JP) .................................. 2021-117686

(51) Int. Cl.
*H10N 30/082* (2023.01)
(52) U.S. Cl.
CPC ................................ *H10N 30/082* (2023.02)

(58) Field of Classification Search
None
See application file for complete search history.

(56) References Cited

U.S. PATENT DOCUMENTS

2007/0222342 A1\* 9/2007 Hokibara ................ C03C 15/00
216/13
2015/0381143 A1\* 12/2015 Matsuo .............. G01C 19/5628
216/96

FOREIGN PATENT DOCUMENTS

JP  2007-13382 A  1/2007
JP  2018-148380 A  9/2018

\* cited by examiner

*Primary Examiner* — Roberts P Culbert
(74) *Attorney, Agent, or Firm* — Rankin, Hill & Clark LLP

(57) ABSTRACT

A method for manufacturing a vibrator device includes a first dry etching step of dry-etching a quartz crystal substrate having a first surface and a second surface from the side facing the first surface to form first grooves and part of the outer shapes of a first vibrating arm and a second vibrating arm, a second dry etching step of dry-etching the quartz crystal substrate from the side facing the second surface to form second grooves and part of the outer shapes of the first vibrating arm and the second vibrating arm, and thereafter, a wet etching step of wet-etching the side surfaces of the first vibrating arm and the second vibrating arm.

9 Claims, 21 Drawing Sheets

METHOD FOR MANUFACTURING VIBRATOR DEVICE

The present application is based on, and claims priority from JP Application Serial Number 2021-117686, filed Jul. 16, 2021, the disclosure of which is hereby incorporated by reference herein in its entirety.

BACKGROUND

1. Technical Field

The present disclosure relates to a method for manufacturing a vibrator device.

2. Related Art

JP-A-2007-013382 describes a method for manufacturing a vibrator device including a pair of grooved vibrating arms and formed by dry etching. In the manufacturing method, a substrate made of piezoelectric material is so dry-etched that the width of the grooves is smaller than the width of the portion between the pair of vibrating arms to allow the micro-loading effect to make the depth of the etched grooves smaller than the depth of the etched portion between the pair of vibrating arms, whereby the grooves and the external shape of the vibrator device are formed at once.

In the vibrator device manufacturing method described in JP-A-2007-013382, however, dry etching is performed on both the front and rear surfaces of the substrate, a stepped section can be undesirably formed at the side surface of each of the vibrating arms due to positional shift between the photoresist film formed at the front surface of the substrate and the photoresist film formed at the rear surface of the substrate. The stepped section formed at the side surface of each of the vibrating arms causes a problem of occurrence of unwanted vibration and damage such as cracking and chipping that originates from the stepped sections and occurs when impact acts on the vibrator device.

SUMMARY

A method for manufacturing a vibrator device according to an aspect of the present disclosure is a method for manufacturing a vibrator device including a first vibrating arm and a second vibrating arm extending along a first direction and arranged side by side along a second direction that intersects with the first direction, the first vibrating arm and the second vibrating arm each having a first surface and a second surface in a front-back relationship with the first surface and arranged side by side in a third direction that intersects with the first and second directions, a bottomed first groove that opens on the first surface, a bottomed second groove that opens on the second surface, and a side surface that connects the first surface and the second surface to each other, the method including a preparation step of preparing a quartz crystal substrate having the first surface and the second surface, a first dry etching step of dry-etching the quartz crystal substrate from a side facing the first surface to form the first grooves and part of outer shapes of the first vibrating arm and the second vibrating arm, a second dry etching step of dry-etching the quartz crystal substrate from a side facing the second surface to form the second grooves and part of the outer shapes of the first vibrating arm and the second vibrating arm, and a wet etching step of wet-etching the side surfaces of the first and second vibrating arms.

DESCRIPTION OF EXEMPLARY EMBODIMENTS

1. First Embodiment

A method for manufacturing a vibrator device 1 according to a first embodiment will be described.

The configuration of the vibrator device 1 will first be described with reference to FIGS. 1 and 2, and a method for manufacturing the vibrator device 1 will next be described with reference to FIGS. 3 to 16.

The figures excluding FIG. 3 and FIGS. 14 to 17 show axes X, Y, and Z, which are three axes perpendicular to one another, for convenience of description. The direction along the axis X is also referred to as a direction X as a second direction, the direction along the axis Y is also referred to as a direction Y as a first direction, and the direction along the axis Z is also referred to as a direction Z as a third direction. The side facing the arrow attached to each of the axes is also referred to as a positive side, and the opposite side is also referred to as a negative side. The positive side of the direction Z is also referred to as an "upper side", and the negative side of the direction Z is also referred to as a "lower side". A plan view viewed in the direction Z is also simply referred to as a "plan view". The axes X, Y, and Z correspond to the crystal axes of quartz crystal, as will be described later.

Figure 1:
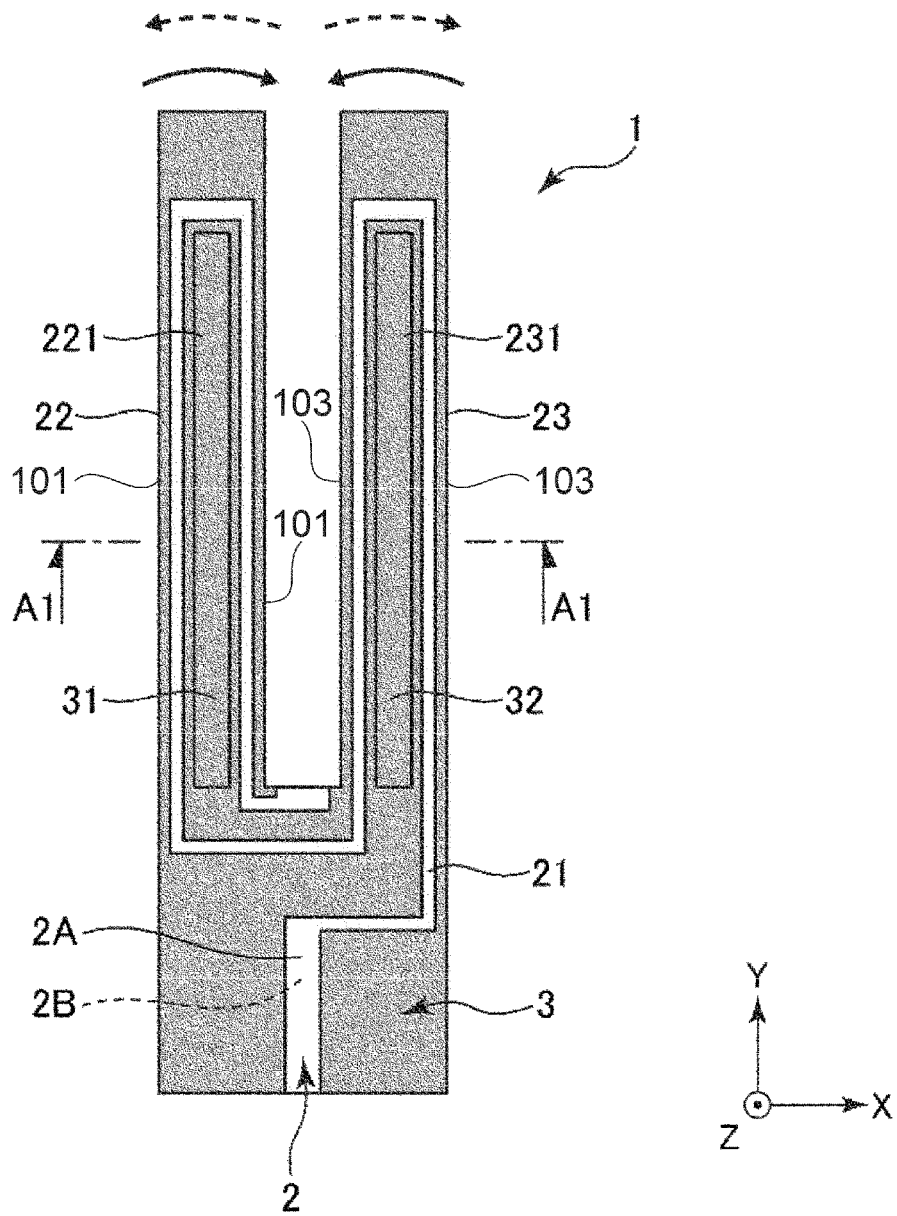
FIG. 1 is a plan view showing a vibrator device according to a first embodiment.
Figure 2:
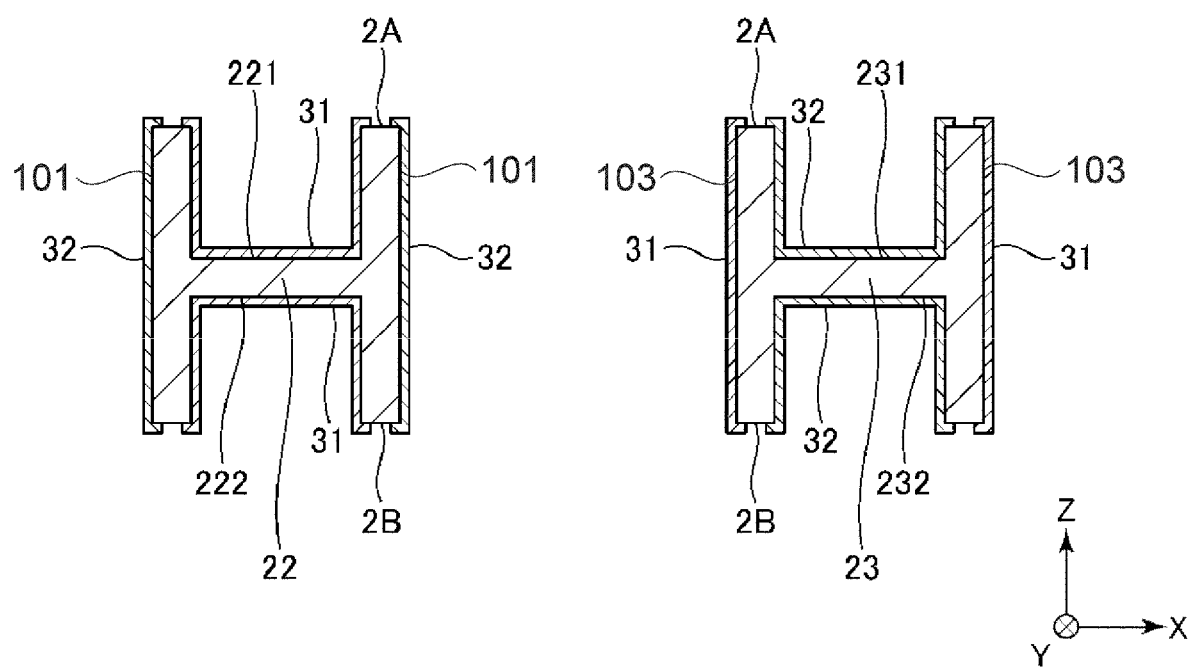
FIG. 2 is a cross-sectional view of the vibrator device taken along the line A1-A1 in FIG. 1.
Figure 3:
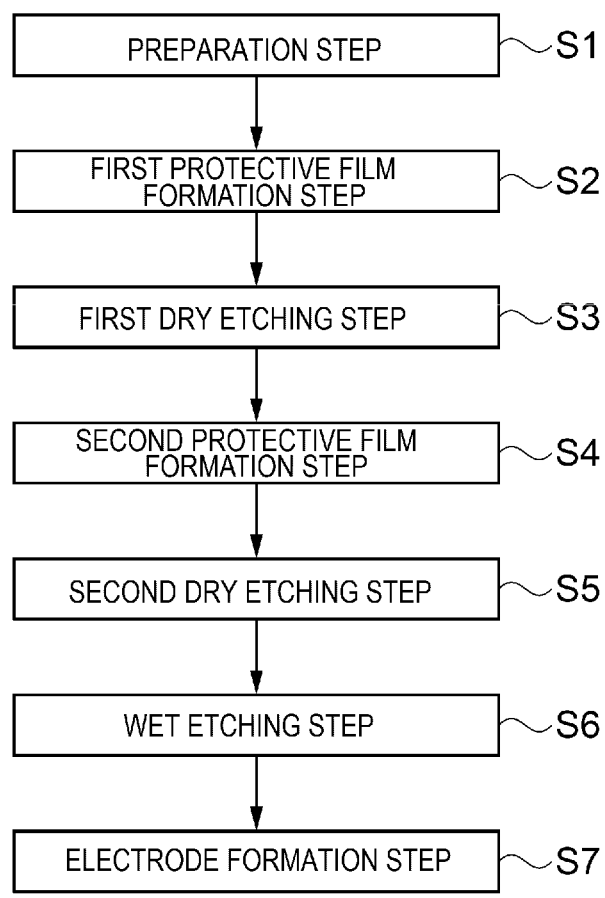
FIG. 3 shows steps of manufacturing the vibrator device according to the first embodiment.

The vibrator device 1 is a tuning-fork-type vibrator device and includes a vibration substrate 2 and an electrode 3 formed at the front surface of the vibration substrate 2, as shown in FIGS. 1 and 2.

The vibration substrate 2 is formed by patterning a Z-cut quartz crystal substrate as a Z-cut quartz crystal plate into a desired shape, spreads in the plane X-Y defined by the axes X and Y, which are the crystal axes of quartz crystal, and has a thickness in the direction Z. The axis X is also called an electrical axis, the axis Y is also called a mechanical axis, and the axis Z is also called an optical axis.

The vibration substrate 2 has the shape of a plate and has a first surface 2A and a second surface 2B, which are front and rear sides with respect with each other, and arranged side by side in the direction Z. The vibration substrate 2 has a base 21, and a first vibrating arm 22 and a second vibrating arm 23 extending from the base 21 along the direction Y and arranged side by side along the direction X.

The first vibrating arm 22 has a bottomed first groove 221, which opens on the first surface 2A, a bottomed second groove 222, which opens on the second surface 2B, and a side surface 101, which connects the first surface 2A and the second surface 2B to each other. Similarly, the second vibrating arm 23 has a bottomed first groove 231, which opens on the first surface 2A, a bottomed second groove 232, which opens on the second surface 2B, and a side surface 103, which connects the first surface 2A and the second surface 2B to each other. The grooves 221, 222, 231, and 232 each extend along the direction Y. The first vibrating arm 22 and the second vibrating arm 23 therefore each have a substantially H-shaped cross-sectional shape. The thus configured vibrator device 1 has a reduced thermoelastic loss and excellent vibration characteristics.

The electrode 3 includes a signal electrode 31 and a ground electrode 32. The signal electrode 31 is disposed at the first surface 2A and the second surface 2B of the first vibrating arm 22 and the side surface 103 of the second vibrating arm 23. On the other hand, the ground electrode 32 is disposed at the side surface 101 of the first vibrating arm 22 and the first surface 2A and the second surface 2B of the second vibrating arm 23. When a drive signal is applied to the signal electrode 31 with the ground electrode 32 grounded, the first vibrating arm 22 and the second vibrating arm 23 perform flexural vibration in the direction X, in which the two vibrating arms repeatedly approach each other and separate from each other, as indicated by the arrows in FIG. 1.

The vibrator device 1 has been briefly described above.

The method for manufacturing the vibrator device 1 will next be described. The method for manufacturing the vibrator device 1 includes a preparation step S1 of preparing a quartz crystal substrate 20, which is the base material of the vibration substrate 2, a first protective film formation step S2 of forming a first protective film 5 at the first surface 2A of the quartz crystal substrate 20, a first dry etching step S3 of dry-etching the quartz crystal substrate 20 from the side facing the first surface 2A via the first protective film 5, a second protective film formation step S4 of forming a second protective film 6 at the second surface 2B of the quartz crystal substrate 20, a second dry etching step S5 of dry-etching the quartz crystal substrate 20 from the side facing the second surface 2B via the second protective film 6, a wet etching step S6 of wet-etching the quartz crystal substrate 20, and an electrode formation step S7 of forming the electrode 3 at the front surface of the vibration substrate 2 produced by the steps described above, as shown in FIG. 3.

The steps described above will be sequentially described below.

Preparation Step S1

Figure 4:
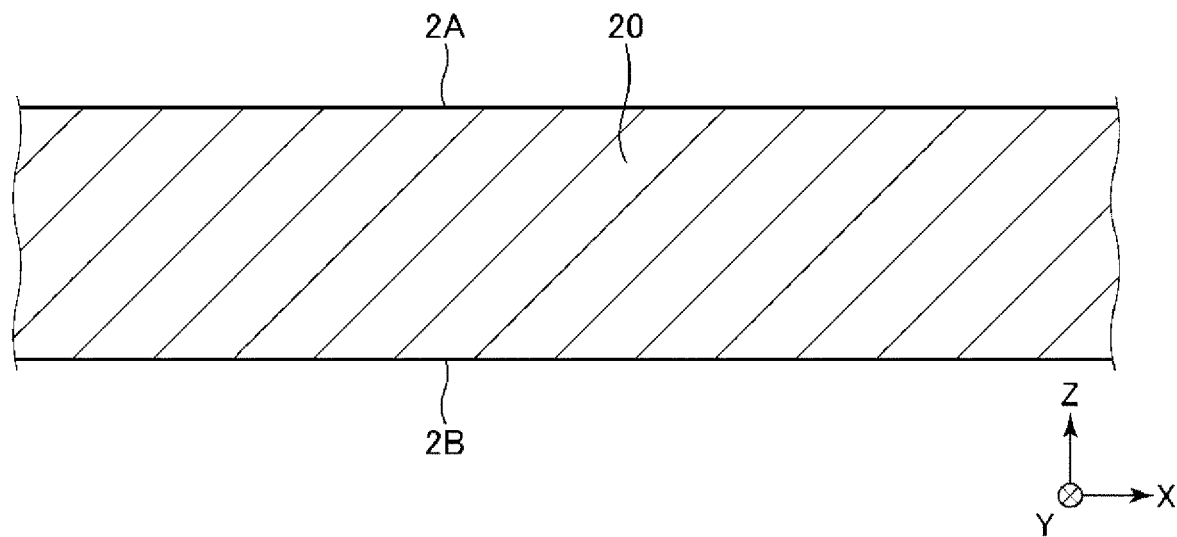
FIG. 4 is a cross-sectional view for describing the method for manufacturing the vibrator device.

The quartz crystal substrate 20, which is the base material of the vibration substrate 2, is prepared, as shown in FIG. 4. The quartz crystal substrate 20 has been prepared, for example, by chemical mechanical polishing (CMP) in the form of a substrate having a desired thickness and has a sufficiently smooth first surface 2A and second surface 2B. A plurality of vibrator devices 1 are formed at once from the quartz crystal substrate 20.

First Protective Film Formation Step S2

Figure 5:
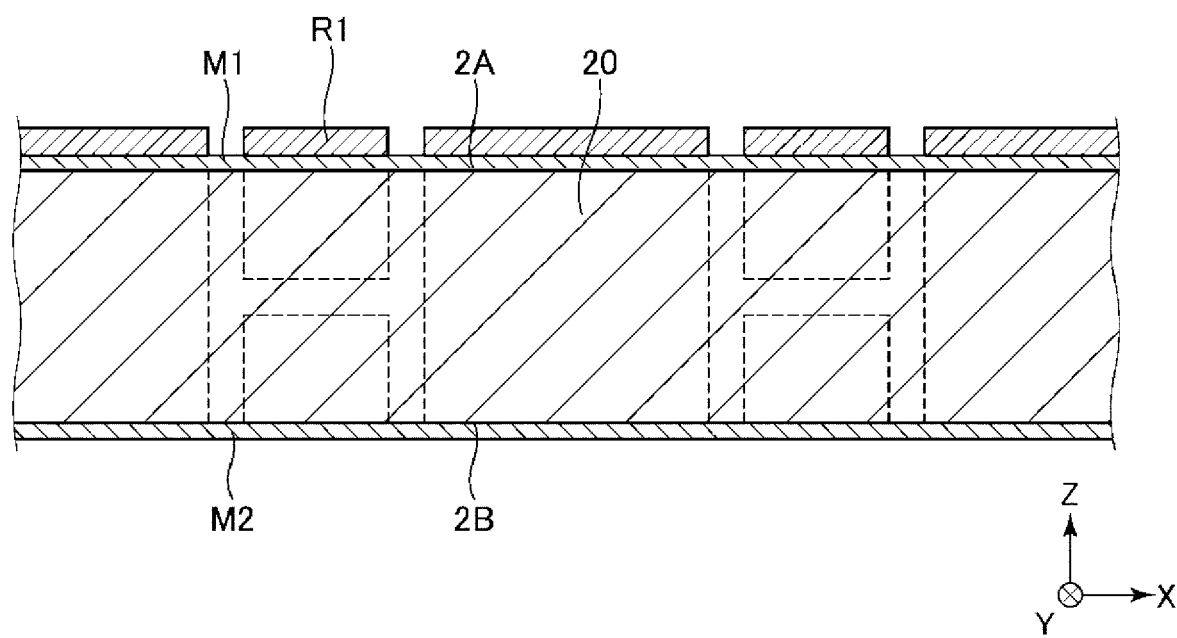
FIG. 5 is a cross-sectional view for describing the method for manufacturing the vibrator device.
Figure 6:
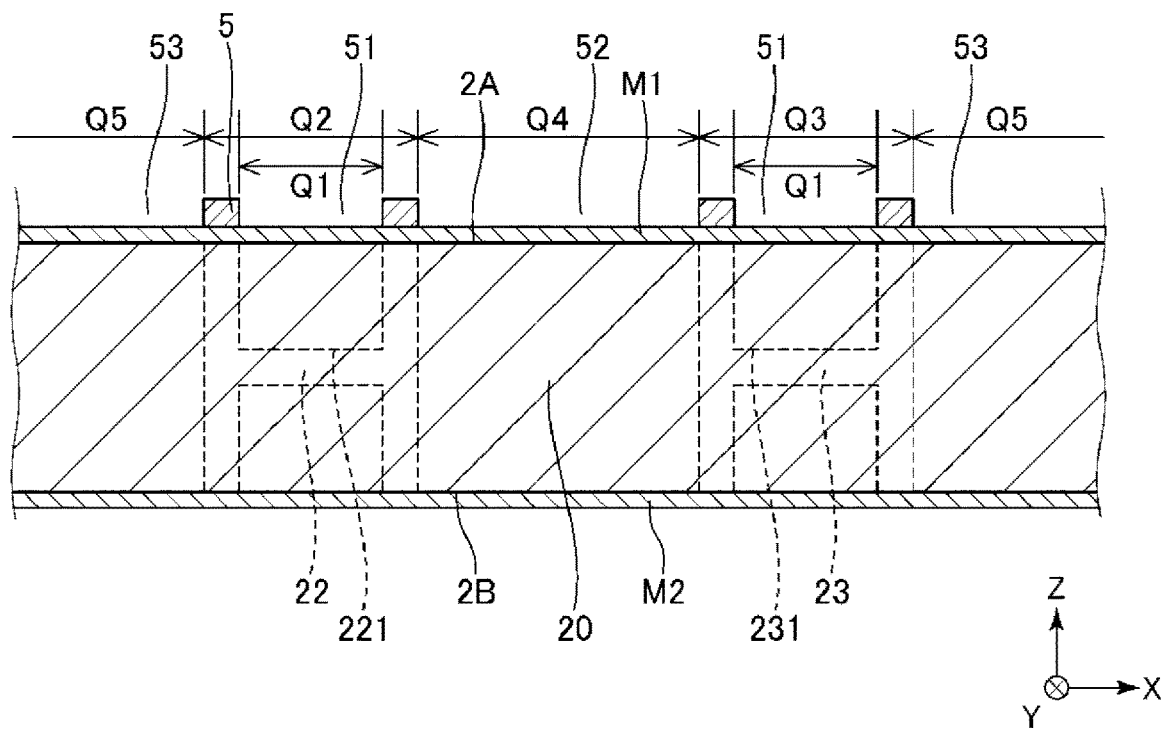
FIG. 6 is a cross-sectional view for describing the method for manufacturing the vibrator device.

Metal films M1 and M2 are deposited at the first surface 2A and the second surface 2B of the quartz crystal substrate 20, as shown in FIG. 5. Thereafter, a first photoresist film R1 is deposited on the metal film M1, and the deposited first photoresist film R1 is patterned. Thereafter, the first protective film 5 is deposited at the openings of the first resist film R1, and then the first photoresist film R1 is removed. As a result, the structure shown in FIG. 6 is achieved. The first protective film 5 is not particularly limited to a specific film and can be any of a variety of metal masks that are resistant to etching, such as a nickel mask.

The first protective film 5 has openings 51, 52, and 53 in portions of the quartz crystal substrate 20 that are removed. Out of the openings, the opening 51 coincides with a first groove formation area Q1, where the first grooves 221 and 231 are formed. The opening 52 coincides an inter-arm area Q4, which is located between a first vibrating arm formation area Q2, where the first vibrating arm 22 is formed, and a second vibrating arm formation area Q3, where the second vibrating arm 23 is formed. The opening 53 coincides with an inter-device area Q5, which is located between adjacent vibration substrates 2. That is, the first protective film 5 is formed in the area excluding the first groove formation area Q1, the inter-arm area Q4, and the inter-device area Q5.

First Dry Etching Step S3

Figure 7:
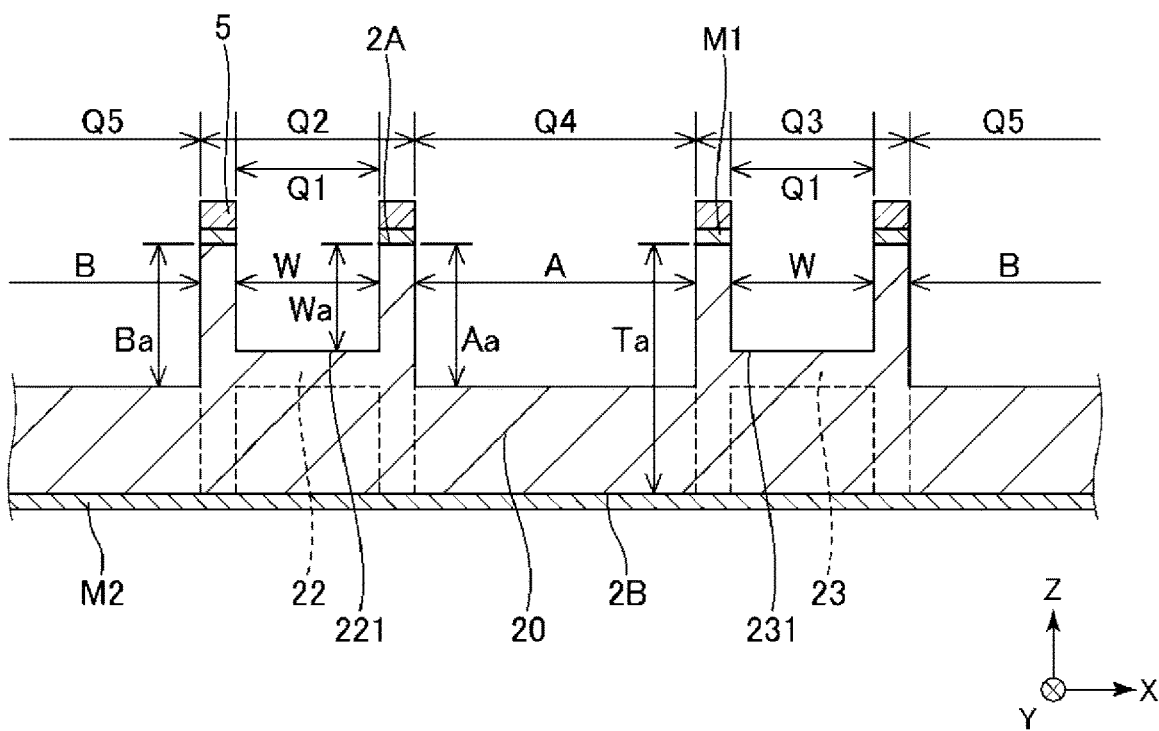
FIG. 7 is a cross-sectional view for describing the method for manufacturing the vibrator device.

The quartz crystal substrate 20 is dry-etched from the side facing the first surface 2A via the first protective film 5 to simultaneously form the first grooves 221 and 231 at the first surface 2A and part of the outer shape of the vibration substrate 2, as shown in FIG. 7. The phrase "simultaneously form" means that two features are formed at once in a single step. More specifically, the present step is reactive ion etching and is carried out by using a reactive ion etcher (RIE apparatus). A reaction gas introduced into the RIE apparatus is not limited to a specific gas and may, for example, be $SF_6$, $CF_4$, $C_2F_4$, $C_2F_6$, $C_3F_6$, or $C_4F_8$.

The present step ends when the first grooves 221 and 231 reach a desired depth. It is known that the "micro-loading effect", which lowers the etching rate as the pattern density of the first protective film 5 increases, occurs in dry etching. In the present embodiment, comparison between a width W of the first grooves 221 and 231, which is the width in the direction X, and a width A of the inter-arm area Q4, which is the width in the direction X, shows that W<A. Comparison between the width W and a width B of the inter-device area Q5, which is the width in the direction X, shows that W<B. The micro-loading effect therefore causes the etching rate in the first groove formation area Q1 to be lower than that in the inter-arm area Q4 and the inter-device area Q5. Therefore, at the end of the present step, a depth Wa of the first grooves 221 and 231 is smaller than depths Aa and Ba of the outer shape of the vibration substrate 2. That is, Wa<Aa (Wa/Aa<1) and Wa<Ba (Wa/Ba<1) are satisfied. The depths Aa and Ba are each greater than or equal to half the thickness of the quartz crystal substrate 20. That is, let Ta be the thickness of the quartz crystal substrate 20, and Aa 0.5 Ta and Ba 0.5 Ta are satisfied. The depths Wa, Aa, and Ba are defined as the depths of the deepest portions in the areas having the widths W, A, and B, respectively.

After the present step is completed, the first protective film 5 and the metal film M1 are removed, and the rear surface of the quartz crystal substrate 20 is ready to be processed.

Figure 8:
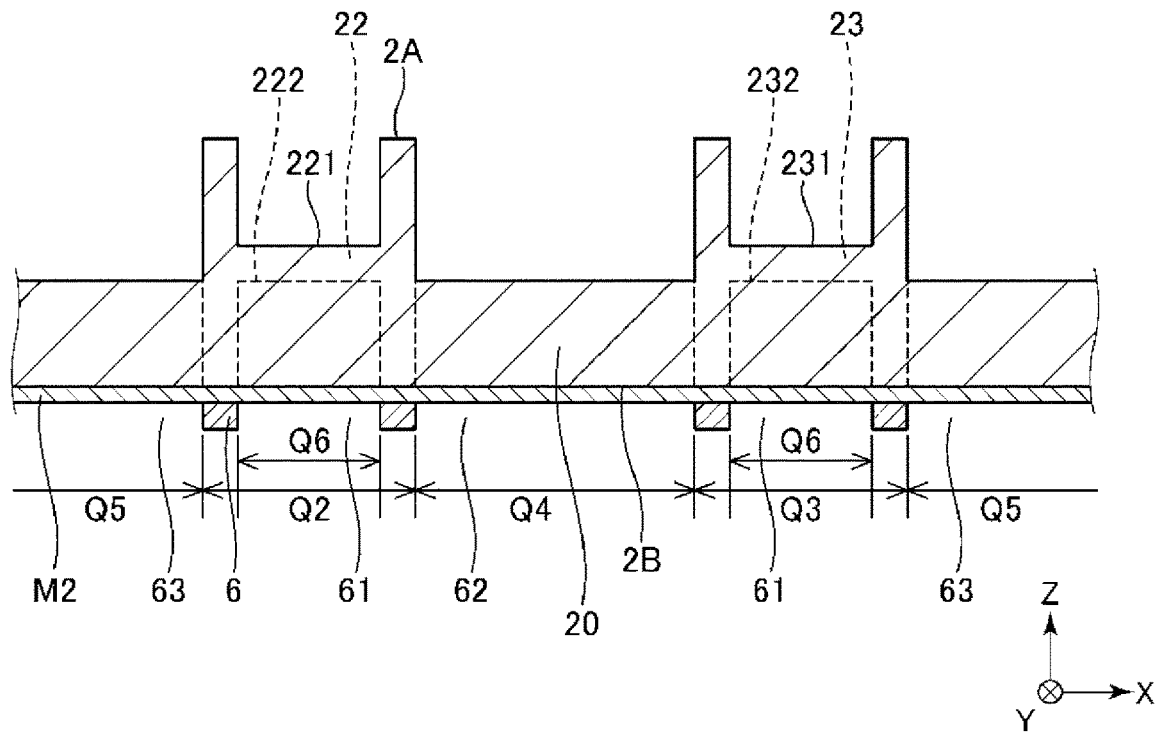
FIG. 8 is a cross-sectional view for describing the method for manufacturing the vibrator device.

Second protective film formation step S4 The second protective film 6 is deposited on the metal film M2, as shown in FIG. 8. The method for depositing the second protective film 6 is the same as the aforementioned method for depositing the first protective film 5. The second protective film 6 has openings 61, 62, and 63 in portions of the quartz crystal substrate 20 that are removed. Out of the openings, the opening 61 coincides with a second groove formation area Q6, where the second grooves 222 and 232 are formed. The opening 62 coincides with the inter-arm area Q4. The opening 63 coincides with the inter-device area Q5.

Second Dry Etching Step S5

Figure 9:
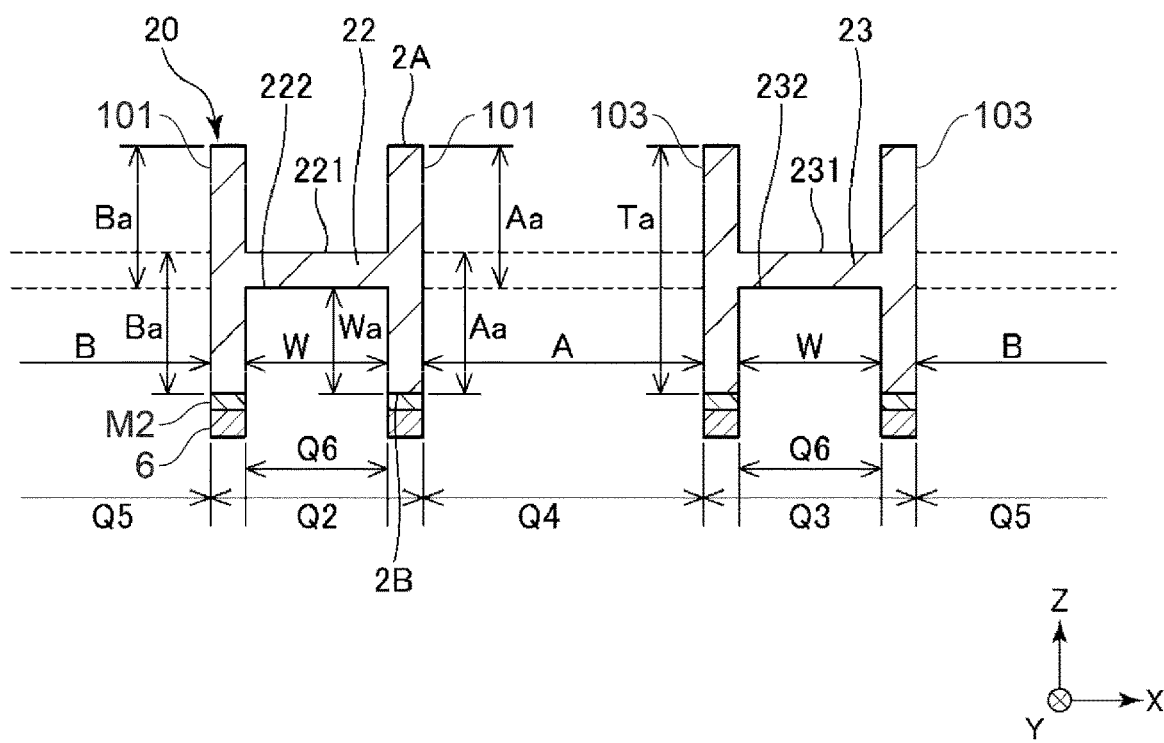
FIG. 9 is a cross-sectional view for describing the method for manufacturing the vibrator device.

The quartz crystal substrate 20 is dry-etched from the side facing the second surface 2B via the second protective film 6 to simultaneously form the second grooves 222 and 232 at the second surface 2B and part of the outer shape of the vibration substrate 2, as shown in FIG. 9. The present step is carried out in the same manner in accordance with which the first dry etching step S3 is carried out.

The present step ends when the second grooves 222 and 232 reach a desired depth. In the present embodiment, comparison between the width W of the second grooves 222 and 232, which is the width in the direction X, and the width A of the inter-arm area Q4, which is the width in the direction X, shows that W<A. Comparison between the width W and the width B of the inter-device area Q5, which is the width in the direction X, shows that W<B. The micro-loading effect therefore causes the etching rate in the second groove formation area Q6 to be lower than that in the inter-arm area Q4 and the inter-device area Q5. The depth Wa of the second grooves 222 and 232 is therefore smaller than depths Aa and Ba of the outer shape of the vibration substrate 2. That is, Wa<Aa (Wa/Aa<1) and Wa<Ba (Wa/Ba<1) are satisfied. The depths Aa and Ba are each greater than or equal to half the thickness of the quartz crystal substrate 20. That is, Aa≥0.5 Ta and Ba≥0.5 Ta are satisfied. The inter-arm area Q4 and the inter-device area Q5 therefore pass through the quartz crystal substrate 20. The inter-arm area Q4 and the inter-device area Q5 passing through the quartz crystal substrate 20 form the first vibrating arm 22 and the second vibrating arm 23.

Figure 10:
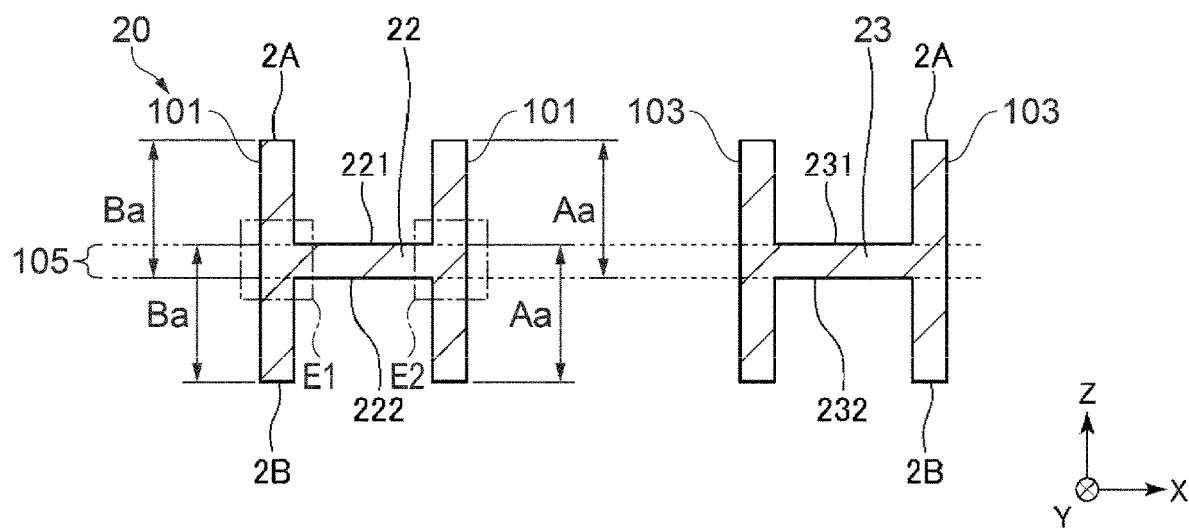
FIG. 10 is a cross-sectional view for describing the method for manufacturing the vibrator device.

After the present step is completed, the second protective film 6 and the metal film M2 are removed, as shown in FIG. 10.

As described above, in the first dry etching step S3, the quartz crystal substrate 20 is dry-etched from the side facing the first surface 2A, and in the second dry etching step S5, the quartz crystal substrate 20 is dry-etched from the side facing the second surface 2B. The outer shape of the vibration substrate 2 is thus formed. Therefore, for example, when the positions of the first protective film 5 and the second protective film 6 shift from each other in the plan view viewed in the direction Z due, for example, to manufacturing variations, stepped sections are formed in some cases at the side surface 101 of the first vibrating arm 22 and the side surface 103 of the second vibrating arm 23 in an area 105, where the dry etching in the first dry etching step S3 and the dry etching in the second dry etching step S5 are both performed.

Figure 11:
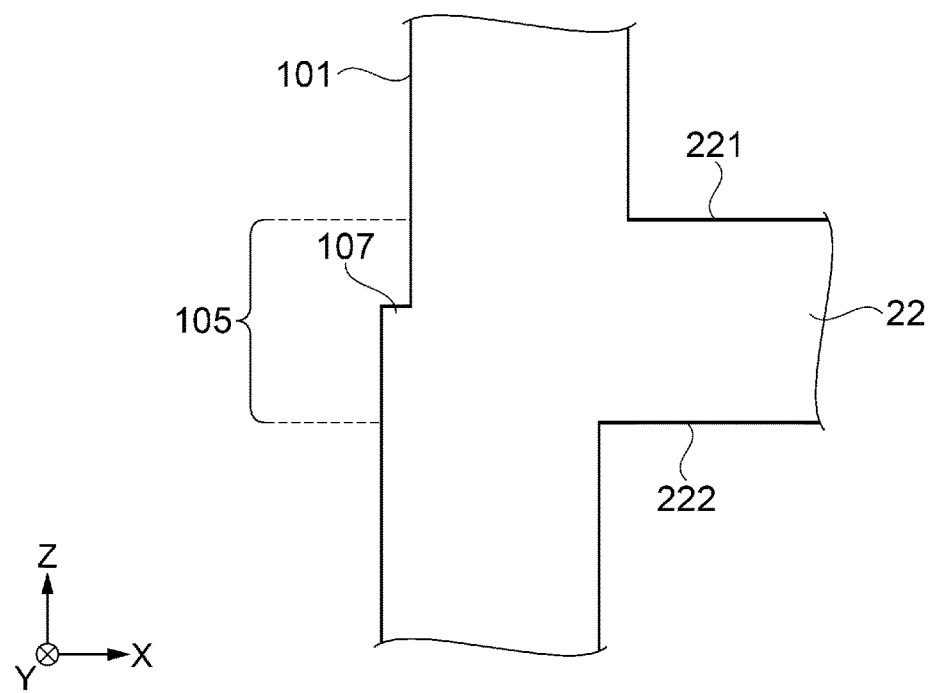
FIG. 11 is a cross-sectional view corresponding to the position of a section E1 in FIG. 10.
Figure 12:
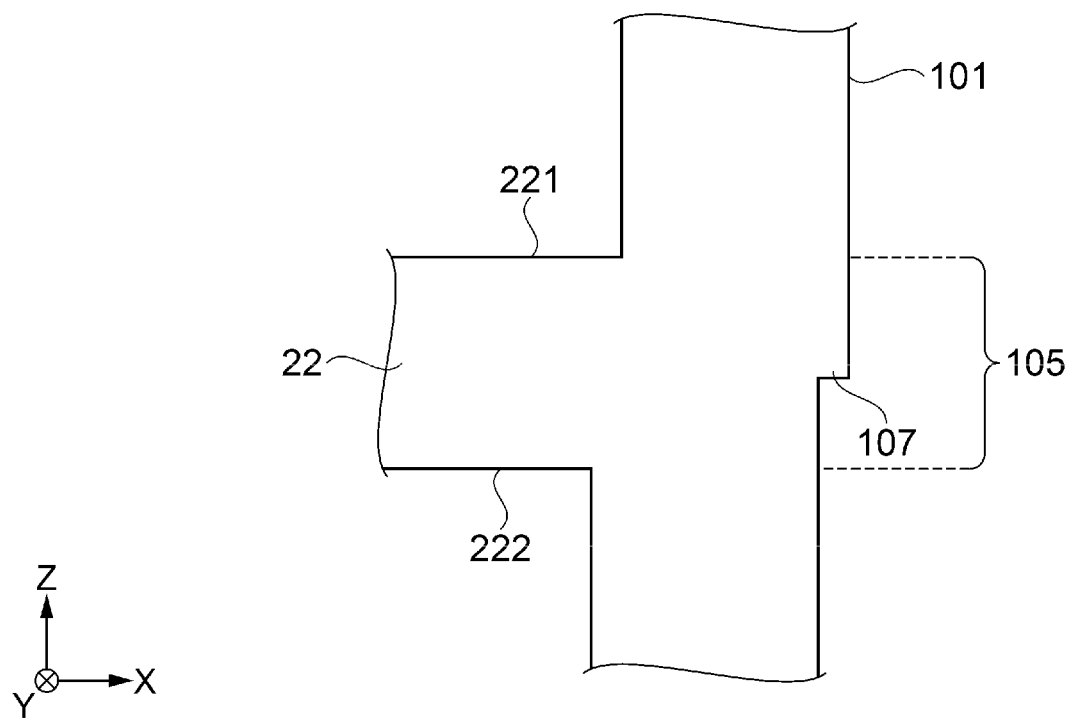
FIG. 12 is a cross-sectional view corresponding to the position of a section E2 in FIG. 10.

For example, when the position of the second protective film 6 shifts toward the negative side of the direction X from the position of the first protective film 5, as shown in FIGS. 11 and 12, a stepped section 107 is formed at the side surface 101 of the first vibrating arm 22 because the outer shape of the vibration substrate 2 formed in the second dry etching step S5 shifts toward the negative side of the direction X from the outer shape of the vibration substrate 2 formed in the first dry etching step S3. Also, when the position of the second protective film 6 shifts toward the positive side of the direction X from the position of the first protective film 5, for example, the stepped section 107 is formed. The above description has been made with reference to the first vibrating arm 22 by way of example, and the stepped section 107 is similarly formed at the side surface 103 of the second vibrating arm 23 when position of the second protective film 6 shifts from the first protective film 5.

Wet Etching Step S6

The wet etching step S6 is the step of wet-etching the quartz crystal substrate 20 by immersing the quartz crystal substrate 20 in an etchant. The etchant can be hydrofluoric acid or ammonium fluoride.

The first vibrating arm 22 and the second vibrating arm 23 are formed at the quartz crystal substrate 20 by the first dry etching step S3 and the second dry etching step S5, as described above. That is, the present step is the step of wet-etching the first vibrating arm 22 and the second vibrating arm 23. In the present step, wet-etching the side surfaces 101 and 103 of the first vibrating arm 22 and the second vibrating arm 23 allows reduction in the size of the stepped sections 107 formed at the side surfaces 101 and 103. Smaller stepped sections 107 prevent unwanted vibration from occurring when the vibrator device 1 is caused to vibrate and the vibrator device 1 from being damaged when impact acts thereon.

In the present step, the amount by which the side surfaces 101 and 103 are etched is preferably greater than or equal to 0.01 µm. The size of the stepped sections 107 is therefore reduced, preventing unwanted vibration from occurring when the vibrator device 1 is caused to vibrate and the vibrator device 1 from being damaged when impact acts thereon. The amount by which the side surfaces 101 and 103 are etched is the amount of displacement, before and after the wet etching step S6, of the side surfaces 101 and 103 in the direction X, which is the direction perpendicular to the side surfaces 101 and 103.

In addition, in the present step, the amount by which the side surfaces 101 and 103 are etched is preferably smaller than or equal to 1 μm. When the amount by which the side surfaces 101 and 103 are etched exceeds 1 μm, each portion of the vibration substrate 2 excluding the stepped sections 107, for example, the first surface 2A, the second surface 2B, the first grooves 221 and 231, and the second grooves 222 and 232, is wet-etched, so that the dimensions of the outer shape of the vibrator device 1 undesirably become different from desired dimensions. The vibrator device 1 can therefore undesirably vibrate at a frequency far off a desired frequency. Maintaining the amount by which the side surfaces 101 and 103 are etched at a value smaller than or equal to 1 μm allows suppression of deviation from the desired frequency.

In addition, in the present step, the amount by which the side surfaces 101 and 103 are etched is preferably smaller than or equal to 0.5 μm. When the amount by which the side surfaces 101 and 103 are etched exceeds 0.5 μm, portions of the vibrating arms 22 and 23, such as the corners thereof, where the first surface 2A and the second surface 2B are connected to the side surfaces 101 and 103, are wet-etched, resulting in a complex shape of the vibrator device 1 that differs from a desired shape. Unwanted vibration may therefore occur when the vibrator device 1 is caused to vibrate, resulting in deterioration of the vibration characteristics, such as the Q value. Maintaining the amount by which the side surfaces 101 and 103 are etched at a value smaller than or equal to 0.5 μm allows suppression of occurrence of undesired vibration.

Figure 13:
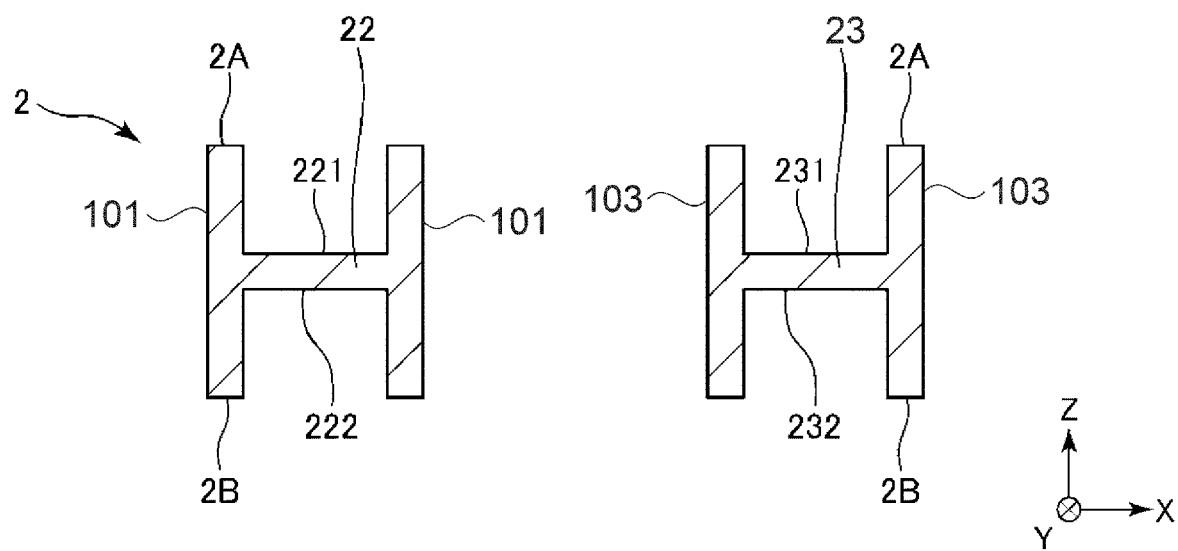
FIG. 13 is a cross-sectional view for describing the method for manufacturing the vibrator device.

A plurality of vibration substrates 2 are collectively formed from the quartz crystal substrate 20 by carrying out steps S1 to S6 above, as shown in FIG. 13.

Electrode Formation Step S7

A metal film is deposited at the front surface of the vibration substrate 2, and the metal film is patterned to form the electrode 3.

The vibrator device 1 is thus produced.

As described above, the dry etching allows processing without being affected by the crystal planes of quartz crystal, thus achieving excellent dimensional accuracy. Forming the first grooves 221 and 231 and the second grooves 222 and 232 together with the outer shape of the vibration substrate 2 allows reduction in the number of steps of manufacturing the vibrator device 1 and the cost thereof. Furthermore, positional shift of the first grooves 221 and 231 and the second grooves 222 and 232 from the outer shape is prevented, whereby the accuracy of formation of the vibration substrate 2 increases.

The wet etching allows reduction in the size of the stepped sections 107 formed at the side surface 101 of the first vibrating arm 22 and the side surface 103 of the second vibrating arm 23 when the quartz crystal substrate is dry-etched from both the sides facing the first surface 2A and the second surface 2B. The smaller stepped sections 107 can suppress unwanted vibration that occurs when the vibrator device 1 is caused to vibrate and damage made to the vibrator device 1 when impact acts thereon.

The method for manufacturing the vibrator device 1 has been described above.

The conditions under which the micro-loading effect more reliably manifests itself will next be described with reference to FIGS. 14 and 15.

Figure 14:
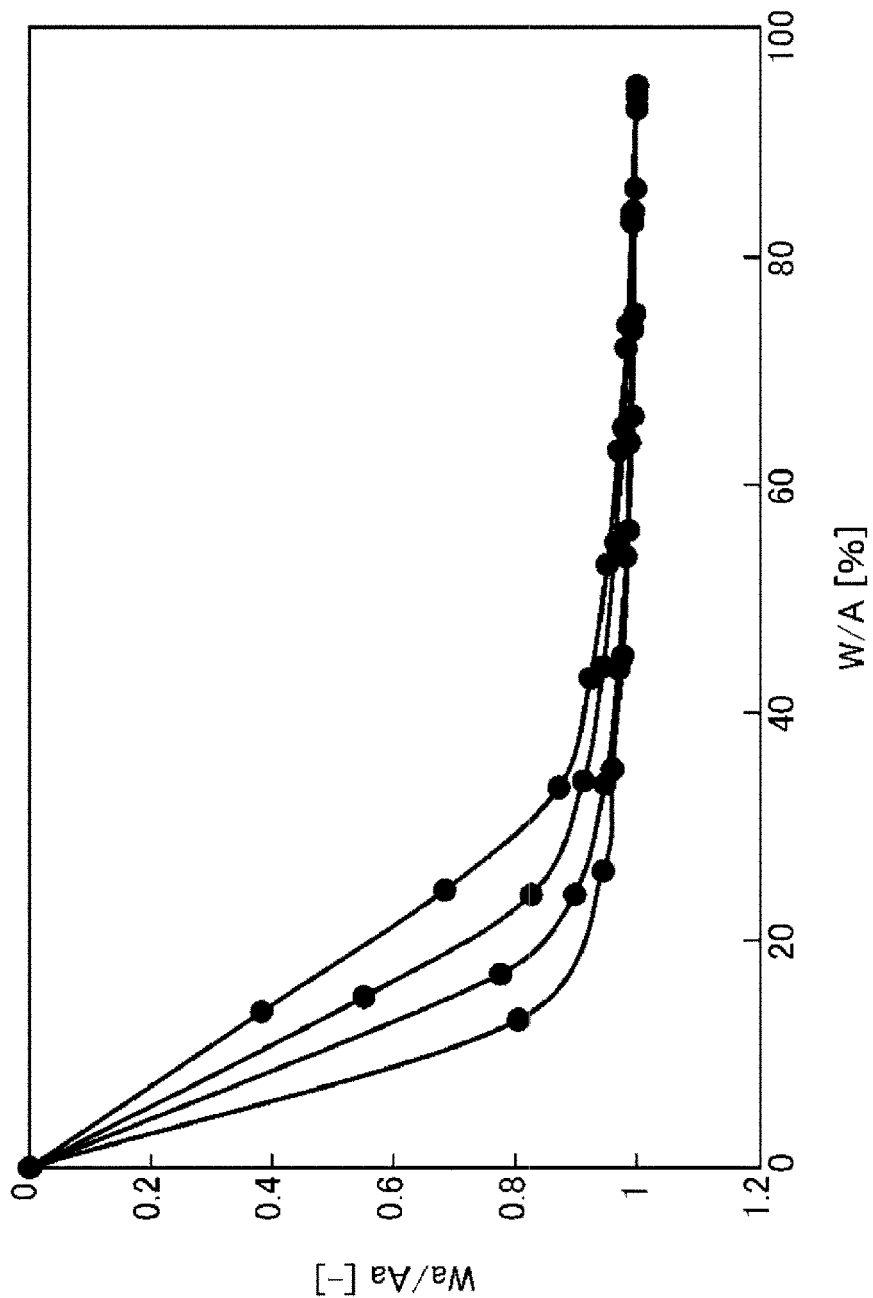
FIG. 14 shows graphs illustrating the relationship between W/A and Wa/Aa for different etching periods.

FIG. 14 shows the relationship between W/A and Wa/Aa for different etching periods. As can be seen from FIG. 14, the micro-loading effect notably manifests itself at each point of time in the region where W/A 40% is satisfied.

The micro-loading effect manifests itself in a variety of manners in accordance with the type of reaction gas used in the dry etching. FIG. 15 shows the relationship between W/A and Wa/Aa in the case where three typical reaction gases different from one another are used.

For example, a fluorine-based gas having a large carbon content, such as $C_2F_4$, $C_2F_6$, $C_3F_6$, and $C_4F_8$, is used as the reaction gas, a thick sidewall protective film is produced, and the slope of the graph representing the relationship decreases, as in the case of a gas type G3. Wa/Aa therefore tends to increase with the width A being smaller than the width W, whereby the size of the vibrator device 1 can be reduced. For example, to design the frequency and the CI value of the vibrator device 1, a width W greater than or equal to a certain value and a depth Wa close to the depth Aa are required in some cases. In the design process, the width A needs to be a small value to reduce the size of the vibrator device 1, and at least one of $C_2F_4$, $C_2F_6$, $C_3F_6$, and $C_4F_8$ is particularly effective in this case.

On the other hand, when a fluorine-based gas containing little or no carbon, such as $SF_6$ and $CF_4$, is used alone or in combination with a fluorine-based gas having a large carbon content, a thin sidewall protective film is produced, and the slope of the graph increases, as in the case of a gas type G1. The width A can therefore be greater than the width W with the depth Wa maintained greater than the depth Aa. For example, when it is desired to achieve a narrow first vibrating arm 22 and second vibrating arm 23 but a large width A while achieving a large depth Wa, at least one of $SF_6$ and $CF_4$ is particularly effective.

Let x be W/A and y be Wa/Aa, and the gas type G1 is expressed by Expression (1) below, a gas type G2 is expressed by Expression (2) below, and the gas type G3 is expressed by Expression (3) below.

$$y=-4.53\times10^{-6}x^4+3.99\times10^{-4}x^3-1.29\times10^{-3}x^2+1.83\times10^{-1}x \quad (1)$$

$$y=-5.59\times10^{-8}x^4+1.48\times10^{-5}x^3-1.43\times10^{-3}x^2+6.09\times10^{-2}x \quad (2)$$

$$y=-6.90\times10^{-10}x^4+5.47\times10^{-4}x^3-1.59\times10^{-3}x^2+2.03\times10^{-2}x \quad (3)$$

Figure 15:
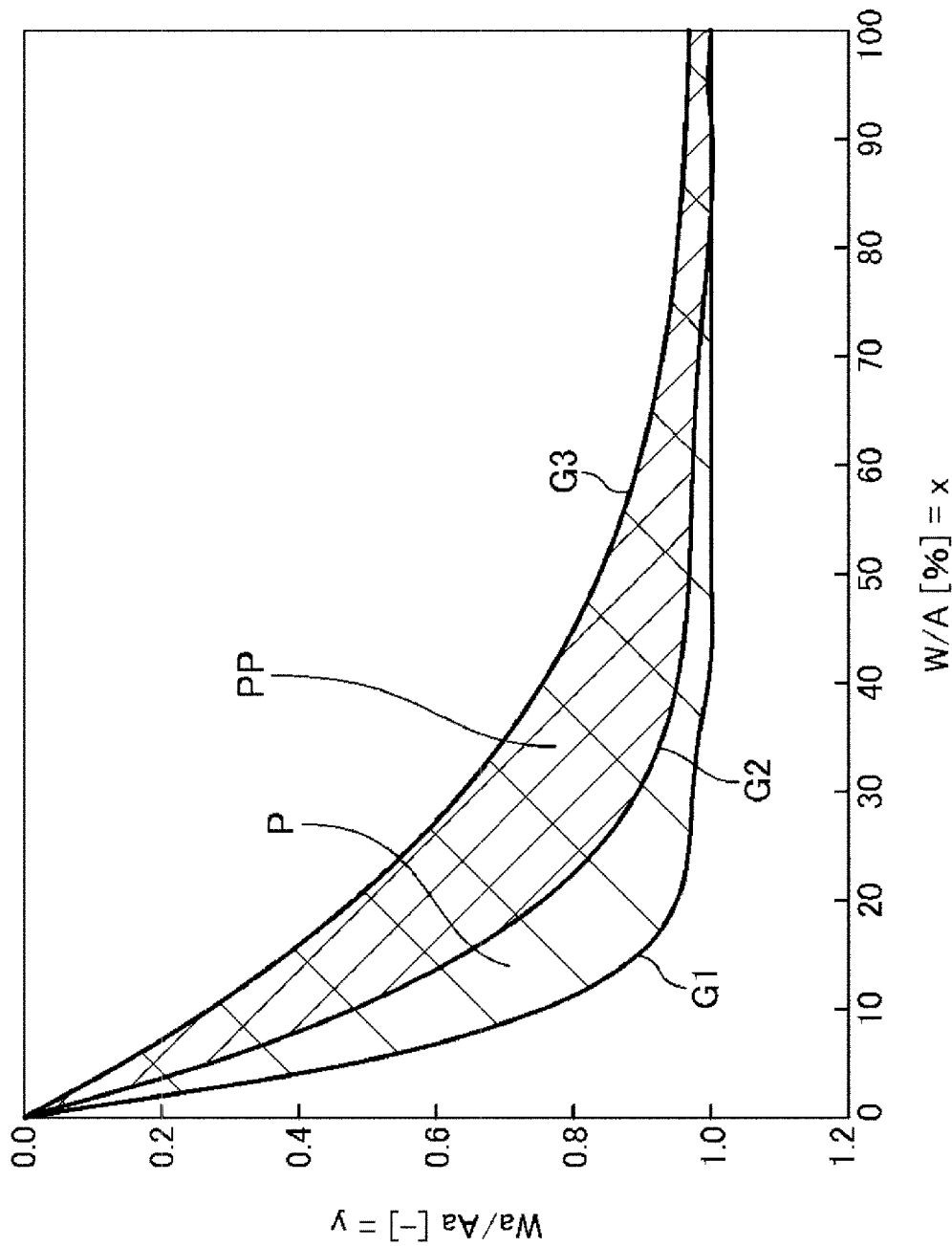
FIG. 15 shows graphs illustrating the relationship between W/A and Wa/Aa for different reaction gases.

When y is in a region P between the graphs expressed by Expressions (1) and (3), as shown in FIG. 15, that is, when y satisfies Expressions (4) and (5) below, the micro-loading effect more reliably manifests itself with a typical reactant gas. Therefore, the vibrator device 1 can be readily manufactured, and the production cost thereof can be reduced.

$$y\geq-4.53\times10^{-6}x^4+3.99\times10^{-4}x^3-1.29\times10^{-3}x^2+1.83\times10^{-1}x \quad (4)$$

$$y\leq-6.90\times10^{-10}x^4+5.47\times10^{-7}x^3-1.59\times10^{-4}x^2+2.03\times10^{-2}x \quad (5)$$

When y does not satisfy Expression (4), the change in the depth Wa is greater than the change in the width W, so that the depth Wa may undesirably vary. The variation can be suppressed by y that satisfies Expression (4). When y does not satisfy Expression (5), it is difficult to increase y in regions where x is large, and the depth Wa decreases. To increase the depth Wa, a condition closer to W=A needs to be achieved, which tends to cause geometrical constraints. The geometrical constraints can be suppressed by y that satisfies Expression (5).

For example, when the width W and the depth Wa are fixed, selecting the gas type G2 allows reduction in the width A as compared with the width A achieved when the gas type G1 is selected and therefore allows reduction in the size of the vibrator device 1. Selecting the gas type G3 allows further reduction in the width A as compared with the width A achieved when the gas type G2 is selected and therefore allows further reduction in the size of the vibrator device 1. As described above, from the viewpoint of size reduction, it is preferable that y is in the region P, and it is more preferable that y is in a region PP between the graphs expressed by Expressions (2) and (3). That is, it is preferable that y satisfies Expression (6) below and Expression (5) described above.

$$y \geq -5.59 \times 10^{-8} x^4 + 1.48 \times 10^{-5} x^3 - 1.43 \times 10^{-3} x^2 + 6.09 \times 10^{-2} x \quad (6)$$

The effect of improvement of the CI value of the vibrator device 1 provided when the first grooves 221 and 231 and the second grooves 222 and 232 are formed will next be described with reference to FIG. 16.

Figure 16:
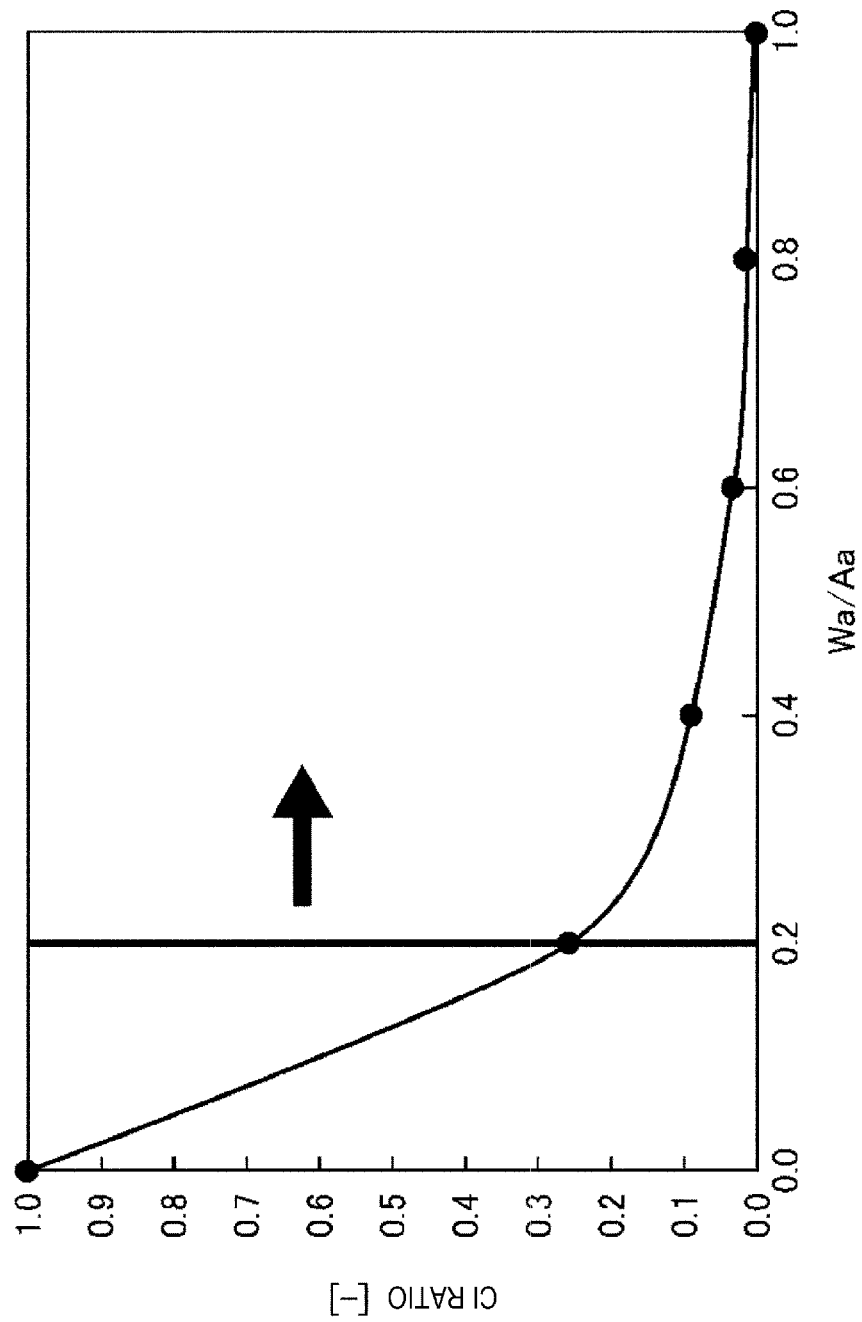
FIG. 16 shows the relationship between Wa/Aa and a CI value.

It is preferable that Wa/Aa≥0.2 is satisfied, as shown in FIG. 16. Note that Wa/Aa<1 in the present embodiment, in which the micro-loading effect is used. The condition described above allows reduction in the CI value to at most 30% of the CI value achieved when none of the first grooves 221 and 231 and the second grooves 222 and 232 is formed. A vibrator device 1 having excellent vibration characteristics can therefore be manufactured. It is further preferable that Wa/Aa≥0.4 is satisfied, in which case, the CI value can be reduced to at most 10% of the CI value achieved when none of the first grooves 221 and 231 and the second grooves 222 and 232 is formed.

The conditions under which the micro-loading effect more reliably manifests itself in the method for manufacturing the vibrator device 1 have been described above.

The method for manufacturing the vibrator device 1 is, as described above, a method for manufacturing the vibrator device 1 including the first vibrating arm 22 and the second vibrating arm 23 extending along the direction Y, which is the first direction, and arranged side by side along the X direction, which intersects with the direction Y and is the second direction, the first vibrating arm 22 and the second vibrating arm 23 having the first surface 2A and the second surface 2B being front and rear sides with respect to each other and arranged side by side in the direction Z, which intersects with the directions Y and X and is the third direction, the bottomed first grooves 221 and 231, which open via the first surface 2A, the bottomed second grooves 222 and 232, which open via the second surface 2B, and the side surfaces 101 and 103, which connect the first surface 2A and the second surface 2B to each other. The method includes step S1 of preparing the quartz crystal substrate 20 having the first surface 2A and the second surface 2B, the first dry etching step S3 of dry-etching the quartz crystal substrate 20 from the side facing the first surface 2A to form the first grooves 221 and 231 and part of the outer shapes of the first vibrating arm 22 and the second vibrating arm 23, the second dry etching step S5 of dry-etching the quartz crystal substrate 20 from the side facing the second surface 2B to form the second grooves 222 and 232 and part of the outer shapes of the first vibrating arm 22 and the second vibrating arm 23, and thereafter, the wet etching step S6 of wet-etching the side surfaces 101 and 103 of the first vibrating arm 22 and the second vibrating arm 23. According to the manufacturing method described above, the size of the stepped sections 107 formed at the side surfaces 101 and 103 of the first vibrating arm 22 and the second vibrating arm 23 can be reduced. The smaller stepped sections 107 can suppress unwanted vibration that occurs when the vibrator device 1 is caused to vibrate and damage made to the vibrator device 1 when impact acts thereon.

In the method for manufacturing the vibrator device 1, it is preferable that the amount by which the side surfaces 101 and 103 are etched in the wet etching step S6 is greater than or equal to 0.01 µm, as described above. The size of the stepped sections 107 is therefore reduced, preventing unwanted vibration from occurring when the vibrator device 1 is caused to vibrate and the vibrator device 1 from being damaged when impact acts thereon.

In the method for manufacturing the vibrator device 1, it is preferable that the amount by which the side surfaces 101 and 103 are etched in the wet etching step S6 is smaller than or equal to 1 µm, as described above. Deviation from the desired frequency that occurs when the vibrator device 1 is caused to vibrate can thus be suppressed.

In the method for manufacturing the vibrator device 1, it is preferable that the amount by which the side surfaces 101 and 103 are etched in the wet etching step S6 is smaller than or equal to 0.5 µm, as described above. Unwanted vibration that occurs when the vibrator device 1 is caused to vibrate can thus be suppressed.

In the method for manufacturing the vibrator device 1, under the definition that Wa represents the depth of the first grooves 221 and 231 formed in the first dry etching step S3 and the depth of the second grooves 222 and 232 formed in the second dry etching step S5, and Aa represents the depth of the outer shapes of the first vibrating arm 22 and the second vibrating arm 23 formed in the first dry etching step S3 and the depth of the outer shapes of the first vibrating arm 22 and the second vibrating arm 23 formed in the second dry etching step S5, it is preferable that Wa/Aa<1 is satisfied in at least one of the first dry etching step S3 and the second dry etching step S5. The first grooves 221 and 231, the second grooves 222 and 232, and the outer shape of the vibration substrate 2 can thus be formed at once. The number of steps of manufacturing the vibrator device 1 and the cost thereof can therefore be reduced. Furthermore, positional shift of the first grooves 221 and 231 and the second grooves 222 and 232 from the outer shape is prevented, whereby the accuracy of formation of the vibration substrate 2 increases.

In the method for manufacturing the vibrator device 1, it is preferable that Wa/Aa≥0.2 is satisfied. The condition described above allows reduction in the CI value to at most 30% of the CI value achieved when none of the first grooves 221 and 231 and the second grooves 222 and 232 is formed. A vibrator device 1 having excellent vibration characteristics can therefore be manufactured.

2. Second Embodiment

Figure 17:
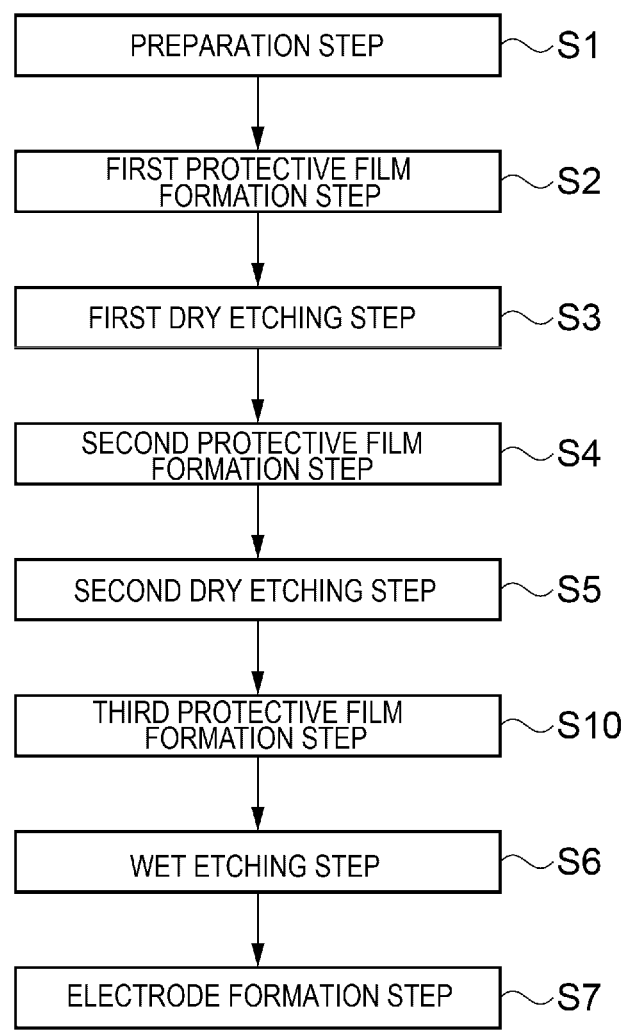
FIG. 17 shows steps of manufacturing the vibrator device according to a second embodiment.

The method for manufacturing the vibrator device 1 according to a second embodiment will be described with reference to FIGS. 17 and 19. The same configurations as those in the first embodiment have the same reference characters, and no redundant description of the same configurations will be made.

The second embodiment is the same as the first embodiment except that a third protective film formation step S10 is provided between the second dry etching step S5 and the wet etching step S6, that third protective films 109 are formed at the first surface 2A and the second surface 2B of the quartz crystal substrate 20 in the third protective film formation step S10, and that the first surface 2A and the second surface 2B of the quartz crystal substrate 20 is masked by the third protective film 109 in the wet etching process S6.

The method for manufacturing the vibrator device according to the second embodiment includes the preparation step S1 of preparing the quartz crystal substrate 20, which is the base material of the vibration substrate 2, the first protective film formation step S2 of forming the first protective film 5 at the first surface 2A of the quartz crystal 20, the first dry etching step S3 of dry-etching the quartz crystal substrate 20 from the side facing the first surface 2A via the first protective film 5, the second protective film formation step S4 of forming the second protective film 6 at the second surface 2B of the quartz crystal substrate 20, the second dry etching step S5 of dry-etching the quartz crystal substrate 20 from the side facing the second surface 2B via the second protective film 6, the third protective film formation step S10 of forming the third protective films 109 at the first surface 2A and the second surface 2B of the quartz crystal substrate 20, the wet etching step S6 of wet-etching the quartz crystal substrate 20, and the electrode formation step S7 of forming the electrode 3 at the front surface of the vibration substrate 2 produced by the steps described above, as shown in FIG. 17.

The preparation step S1 to the second dry etching step S5 are the same as those in the first embodiment and will therefore not be described, and the third protective film formation step S10 will be described. The second protective film 6 and the metal film M2 are removed from the quartz crystal substrate 20 after the completion of the second dry etching step S5, as in the first embodiment.

Third Protective Film Formation Step S10

Figure 18:
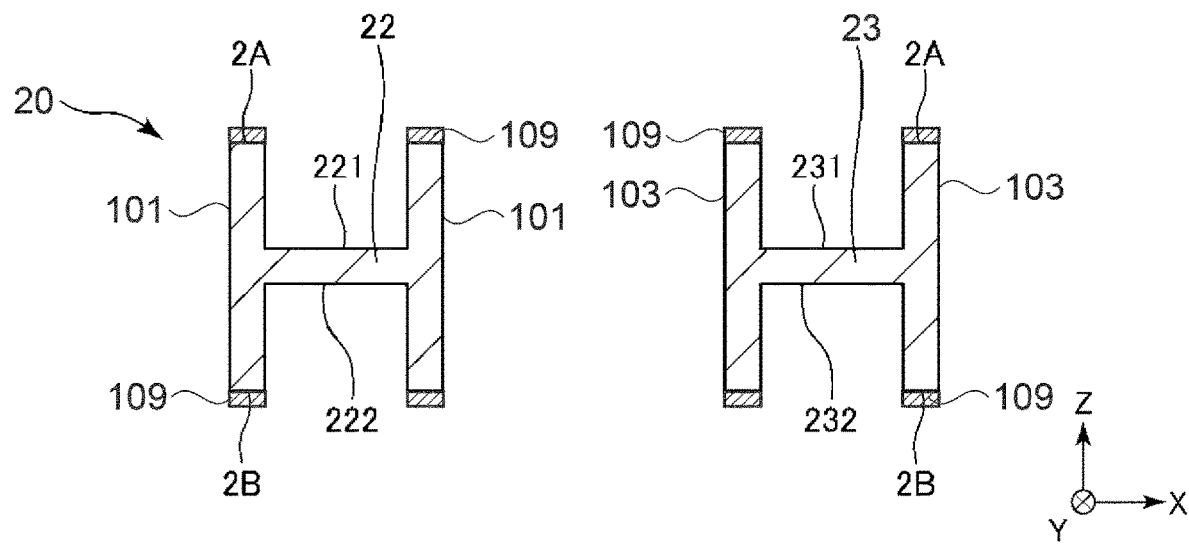
FIG. 18 is a cross-sectional view for describing the method for manufacturing the vibrator device.

The third protective films 109 are formed at the first surface 2A and the second surface 2B of the quartz crystal substrate 20, as shown in FIG. 18. The third protective films 109 are each, for example, a metal film formed by depositing chromium and gold in this order from the side facing the quartz crystal substrate 20. The third protective films 109 can be formed by forming the metal films at the surfaces of the quartz crystal substrate 20, for example, by using sputtering or chemical vapor deposition (CVD) and patterning the metal films by using photolithography and etching techniques.

Wet Etching Step S6

In the present step, the quartz crystal substrate 20 is wet-etched by immersing the quartz crystal substrate 20 in an etchant.

In the second embodiment, prior to the present step, the third protective films 109 are formed at the first surface 2A and the second surface 2B of the quartz crystal substrate 20 in the third protective film formation step S10. Therefore, in the present step, the first surface 2A and the second surface 2B of the quartz crystal substrate 20 are masked by the third protective films 109. In other words, the first surface 2A and the second surface 2B of the first vibrating arm 22 and the second vibrating arm 23 are masked by the third protective films 109. That is, the first surface 2A and the second surface 2B of the first vibrating arm 22 and the second vibrating arm 23 are not wet-etched in the present step. The masking third protective films 109 prevent the dimensions and shape of the vibrator device 1 from being different from the desired dimensions and shape. Deviation from the desired frequency and occurrence of unwanted vibration of the vibrator device 1 can thus be suppressed.

Since no third protective film 109 is formed at the side surfaces 101 and 103 of the first vibrating arm 22 and the second vibrating arm 23, the size of the stepped sections 107 formed at the side surfaces 101 and 103 can be reduced, as in the first embodiment.

Figure 19:
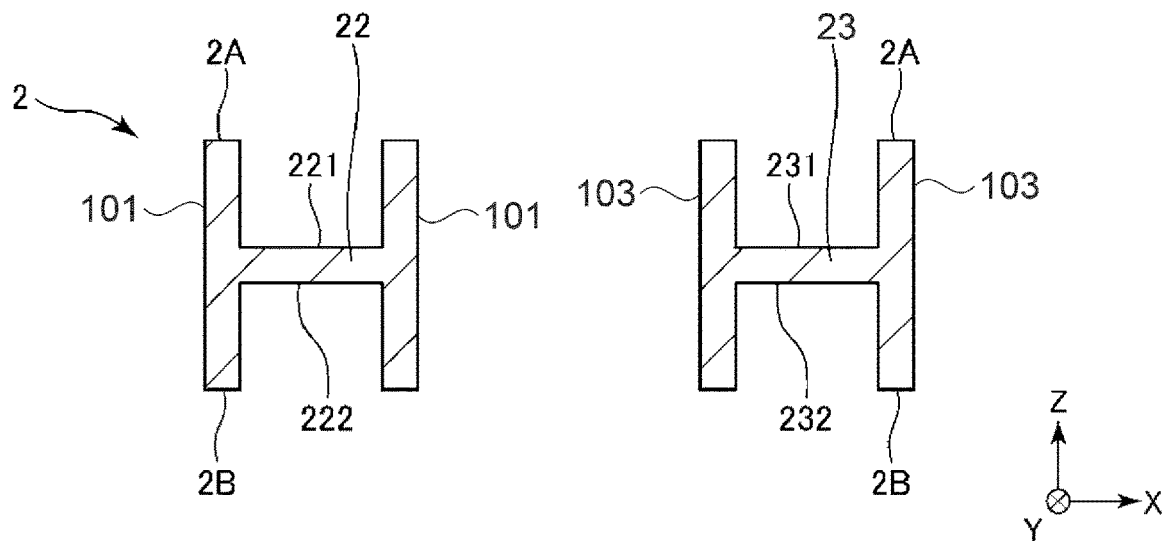
FIG. 19 is a cross-sectional view for describing the method for manufacturing the vibrator device.

After the present step is completed, the third protective films 109 are removed, as shown in FIG. 19. A plurality of vibration substrates 2 are thus collectively formed from the quartz crystal substrate 20.

Electrode Formation Step S7

The present step is carried out in the same manner as in the first embodiment. A metal film is deposited at the front surface of the vibration substrate 2, and the metal film is patterned to form the electrode 3.

The vibrator device 1 is thus produced.

The present embodiment can provide the following effect in addition to the effects provided by the first embodiment.

In the wet etching step S6, the first surface 2A and the second surface 2B of the quartz crystal substrate are masked by the third protective films 109, which prevent the dimensions and shape of the vibrator device 1 from being different from the desired dimensions and shape. Deviation from the desired frequency and occurrence of unwanted vibration of the vibrator device 1 can thus be suppressed.

The vibrator device manufacturing method according to an aspect of the present disclosure has been described above based on the first and second embodiments.

The present disclosure is, however, not limited thereto, and the configuration of each portion can be replaced with any configuration having the same function. Furthermore, any other constituent element may be added to any of the embodiments of the present disclosure. Moreover, the embodiments may be combined as appropriate with each other.

For example, in the embodiments described above, Wa/Aa<1 is satisfied in each of the first dry etching step S3 and the second dry etching step S5, but not necessarily, and Wa/Aa<1 only needs to be satisfied in at least one of the steps.

Figure 20:
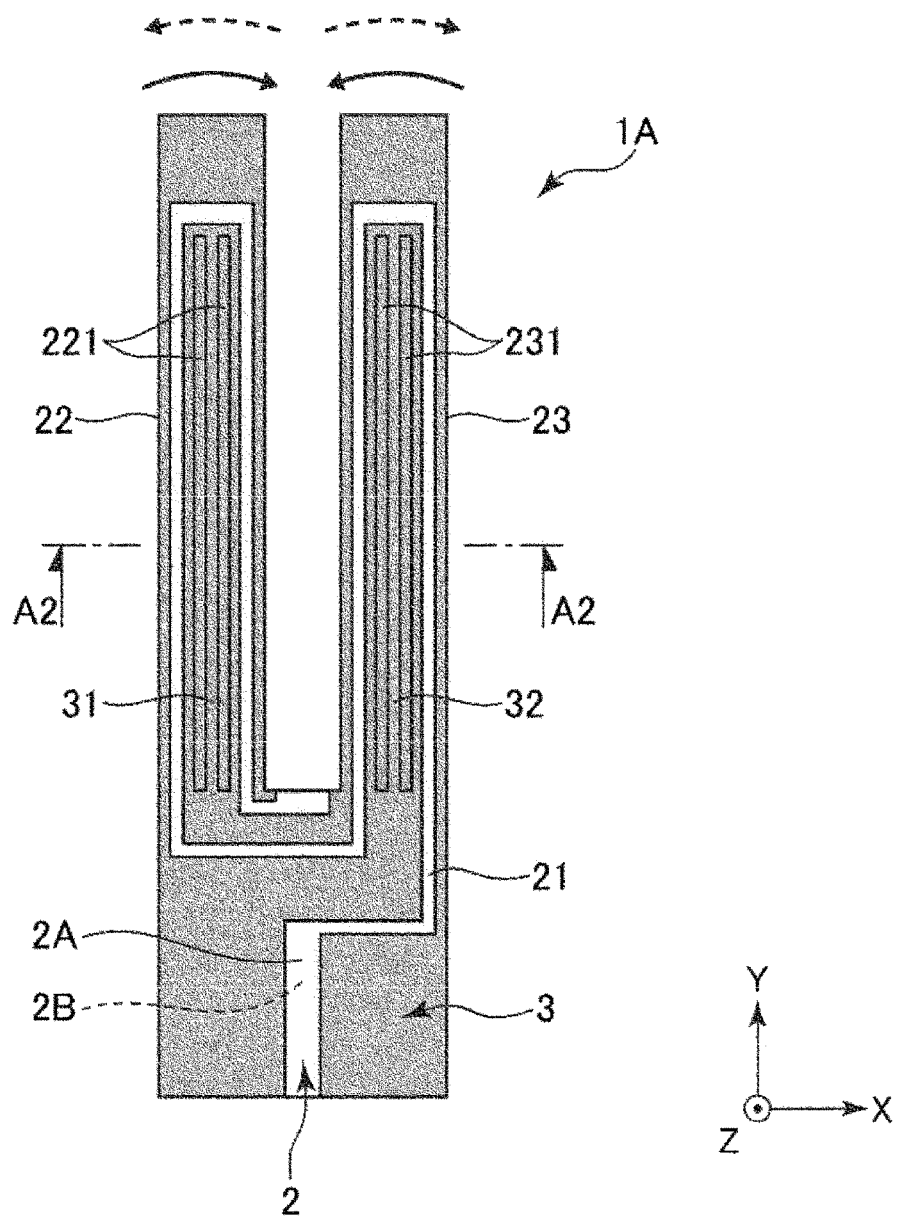
FIG. 20 is a plan view showing a variation of the vibrator device.
Figure 21:
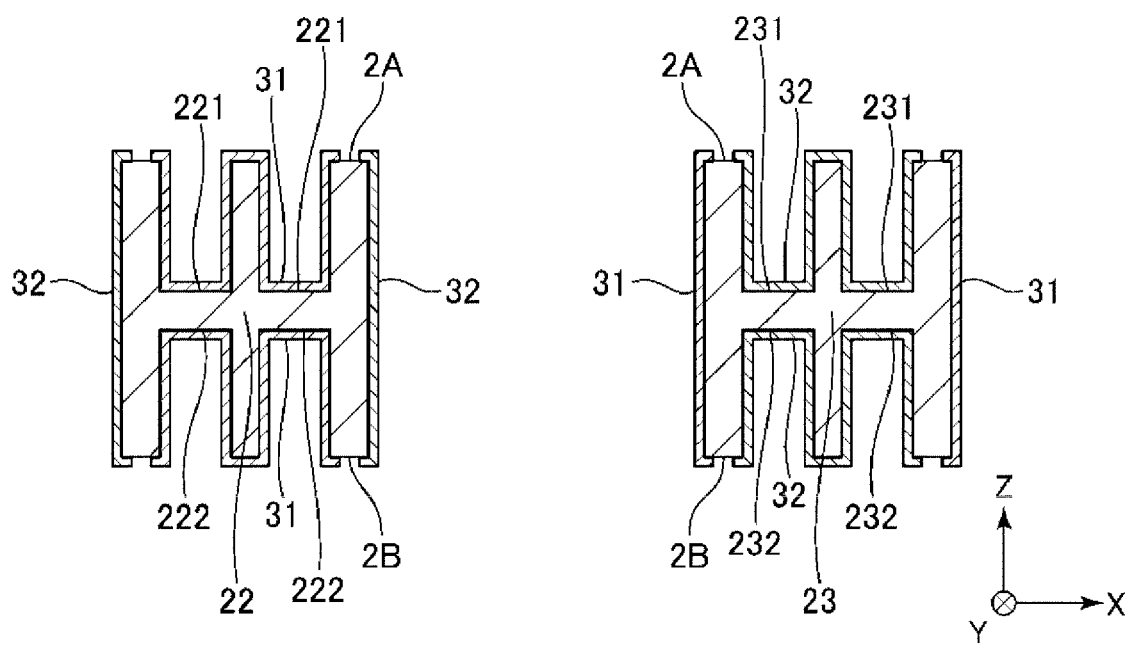
FIG. 21 is a cross-sectional view of the vibrator device taken along the line A2-A2 in FIG. 20.

The vibrator device manufactured by the vibrator device manufacturing method according to an aspect of the present disclosure is not limited to a specific device and may, for example, be a vibrator device 1A shown in FIGS. 20 and 21. In the vibrator device 1A, a pair of first grooves 221 are formed side by side in the direction X at the first surface 2A of the first vibrating arm 22, and a pair of second grooves 222 are formed side by side in the direction X at the second surface 2B. Similarly, a pair of first grooves 231 are formed side by side in the direction X at the first surface 2A of the second vibrating arm 23, and a pair of second grooves 232 are formed side by side in the direction X at the second surface 2B. In the configuration described above, the width W of each of the grooves tends to be decrease because a plurality of grooves are arranged in one direction. It is therefore preferable to use at least one of $SF_6$ and $CF_4$ as the reaction gas in the first dry etching step S3 and the second dry etching step S5. The depth of each of the grooves can therefore be a deep groove, whereby the CI value can be lowered.

Figure 22:
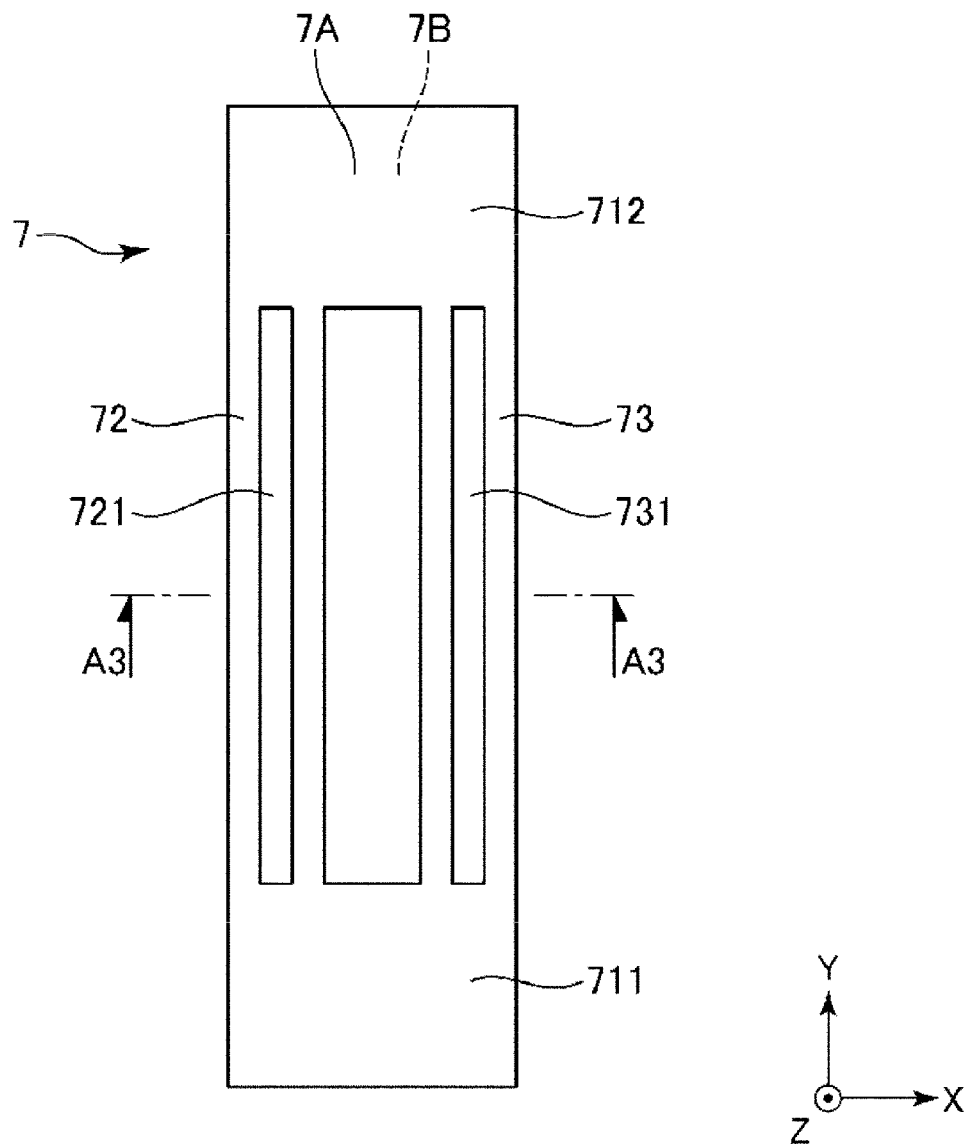
FIG. 22 is a plan view showing another variation of the vibrator device.
Figure 23:
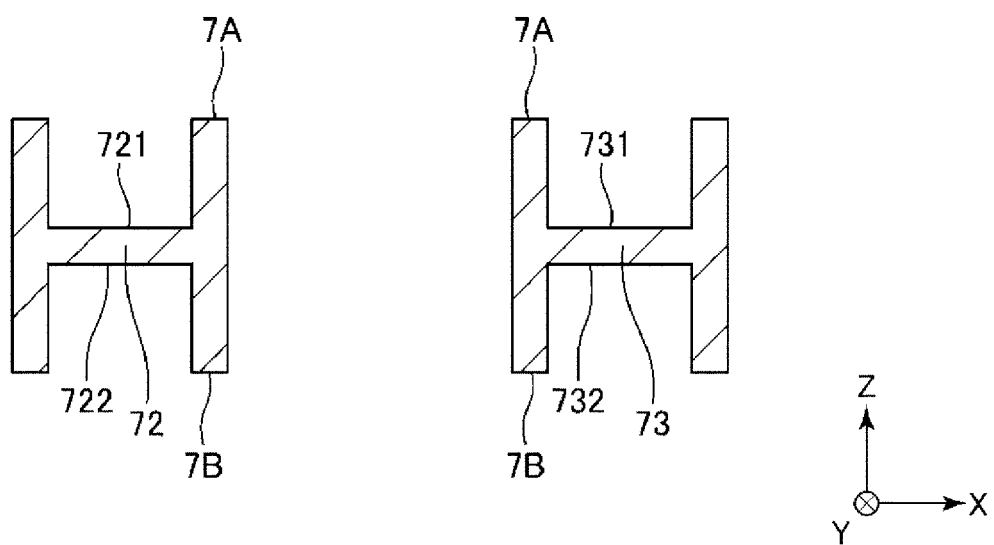
FIG. 23 is a cross-sectional view of the vibrator device taken along the line A3-A3 in FIG. 22.

The vibrator device may instead be a double-tuning-fork-type vibrator device 7 shown in FIGS. 22 and 23. No electrode is shown in FIGS. 22 and 23. The double-tuning-fork-type vibrator device 7 includes a pair of bases 711 and 712, and a first vibrating arm 72 and a second vibrating arm 73, which connect the bases 711 and 712 to each other. The first vibrating arm 72 and the second vibrating arm 73 have bottomed first grooves 721 and 731, which open via a first surface 7A, and bottomed second grooves 722 and 732, which open via a second surface 7B.

Figure 24:
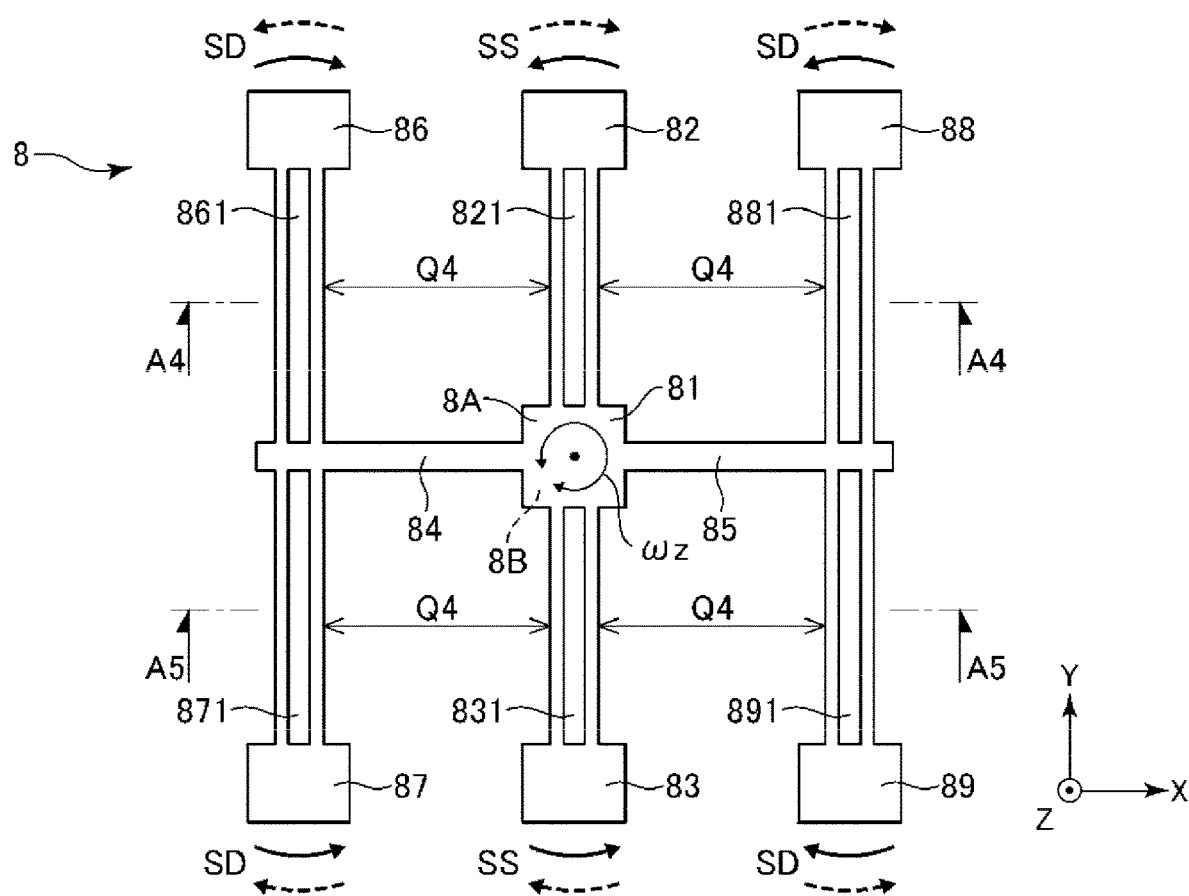
FIG. 24 is a plan view showing another variation of the vibrator device.
Figure 25:
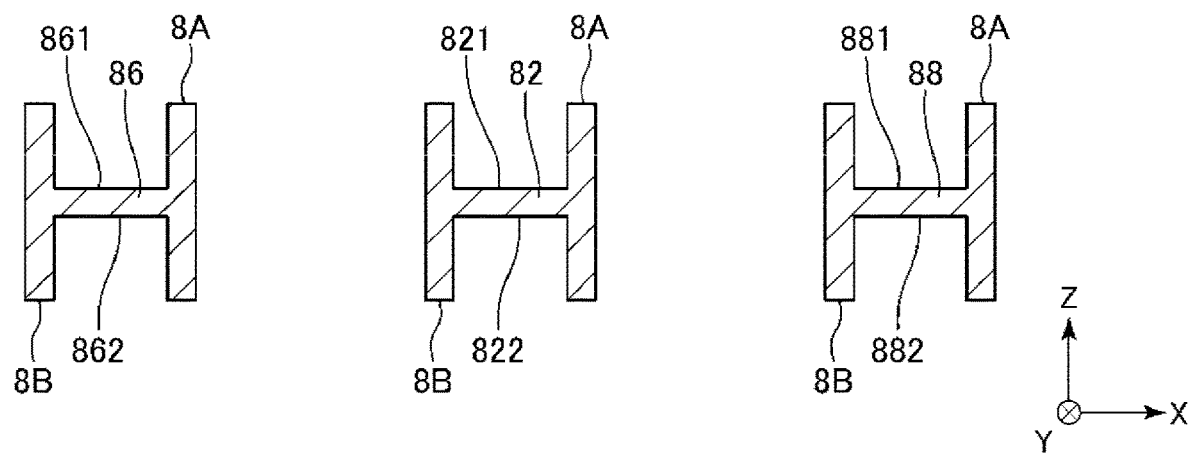
FIG. 25 is a cross-sectional view of the vibrator device taken along the line A4-A4 in FIG. 24.
Figure 26:
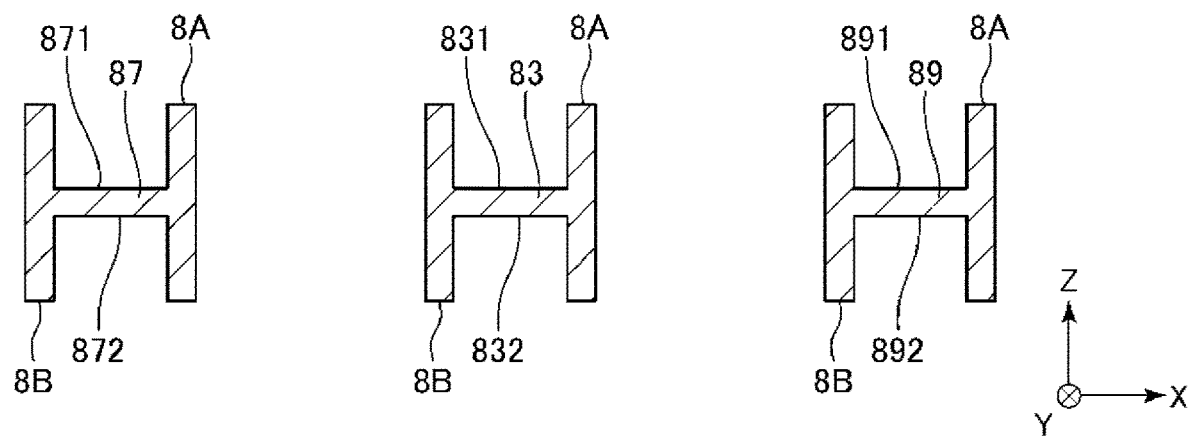
FIG. 26 is a cross-sectional view of the vibrator device taken along the line A5-A5 in FIG. 24.

The vibrator device may still instead, for example, be a gyro vibrator device 8 shown in FIGS. 24 to 26. No electrode is shown in FIGS. 24 to 26. The gyro vibrator device 8 includes a base 81, a pair of detection vibration arms 82 and 83, which extend from the base 81 toward opposite sides of the direction Y, a pair of linkage arms 84 and 85, which extend from the base 81 toward opposite sides of the direction X, drive vibration arms 86 and 87, which extend from the tip of the linkage arm 84 toward opposite sides of the direction Y, and drive vibration arms 88 and 89, which extend from the tip of the linkage arm 85 toward opposite sides of the direction Y. When an angular velocity ωz around the axis Z acts on the thus configured gyro vibrator device 8 with the drive vibration arms 86, 87, 88, and 89 undergoing flexural vibration in the direction labeled with arrows SD in FIG. 24, the Coriolis force newly excites flexural vibration of the detection vibration arms 82 and 83 in the direction labeled with an arrow SS, and the angular velocity ωz is detected based on the electric charges outputted from the detection vibration arms 82 and 83 due to the flexural vibration.

The detection vibration arms 82 and 83 have bottomed first grooves 821 and 831, which open via a first surface 8A, and bottomed second grooves 822 and 832, which open via a second surface 8B. The drive vibration arms 86, 87, 88, and 89 have bottomed first grooves 861, 871, 881, and 891, which open via the first surface 8A, and bottomed second grooves 862, 872, 882, and 892, which open via the second surface 8B. In the thus configured gyro vibrator device 8, for example, pairs of vibrating arms adjacent to each other in the direction X, such as the detection vibration arm 82 and the drive vibration arm 86, the detection vibration arm 82 and the drive vibration arm 88, the detection vibration arm 83 and the drive vibration arm 87, and the detection vibration arm 83 and the drive vibration arm 89, can be regarded as the first and second vibrating arms.

In the case of the gyro vibrator device 8, the inter-arm areas Q4 each need to have a large size for a structural reason. In such a case, the depth Wa may decrease in the region between the graphs expressed by Expressions (2) and (3) described above, undesirably resulting a decrease in sensitivity. It is therefore preferable to use the region between the graphs expressed by Expressions (1) and (2) described above.

Figure 27:
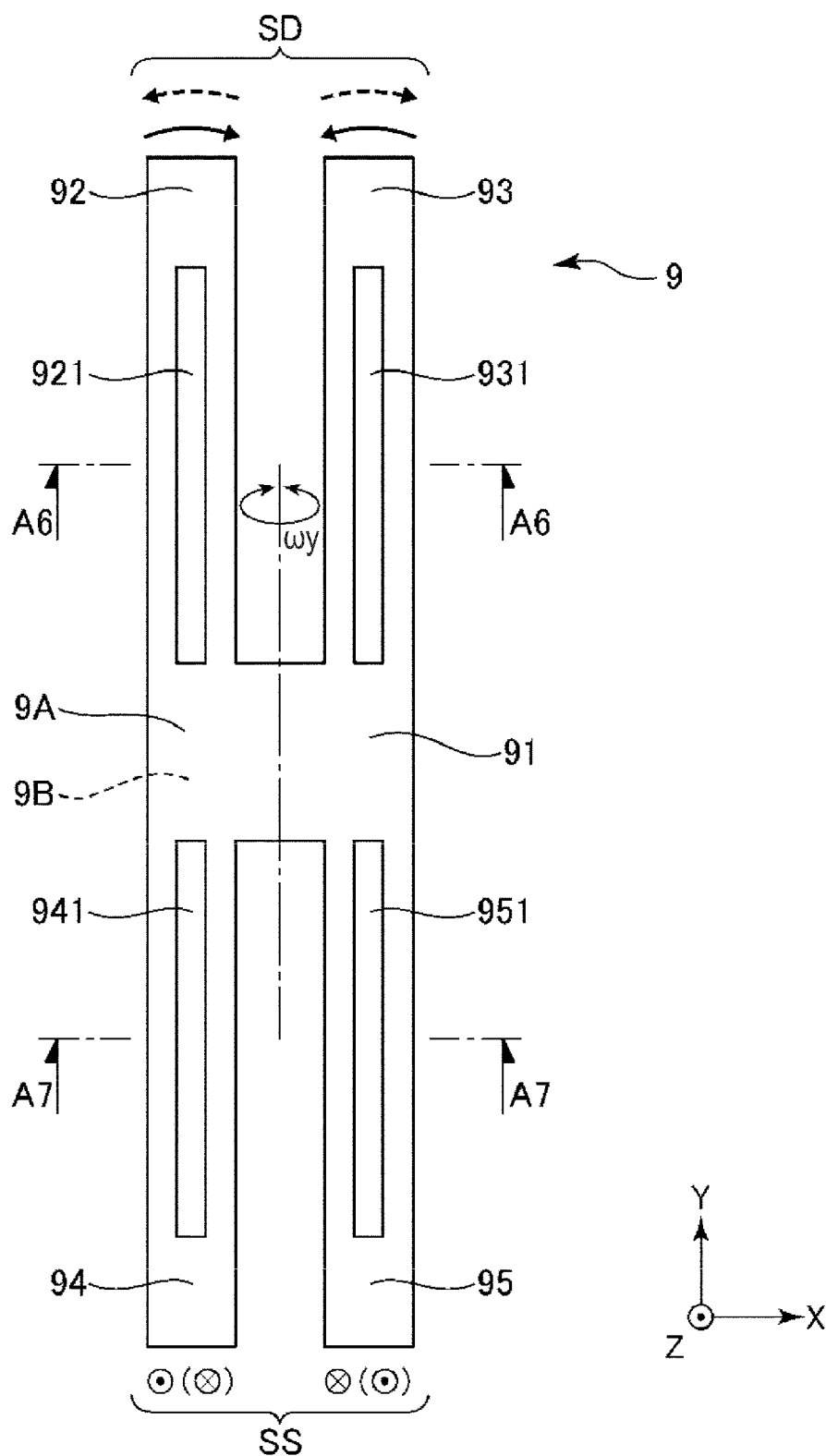
FIG. 27 is a plan view showing another variation of the vibrator device.
Figure 28:
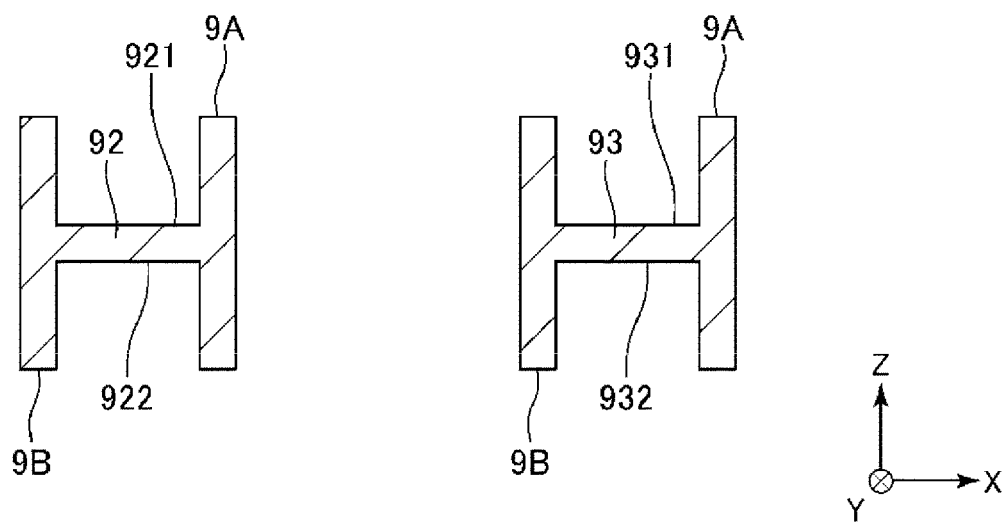
FIG. 28 is a cross-sectional view of the vibrator device taken along the line A6-A6 in FIG. 27.
Figure 29:
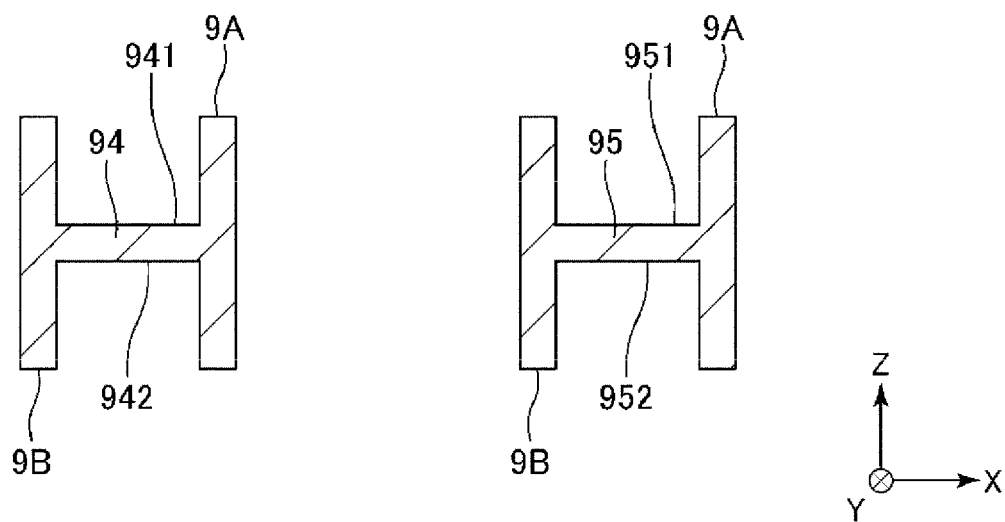
FIG. 29 is a cross-sectional view of the vibrator device taken along the line A7-A7 in FIG. 27.

The vibrator device may still instead, for example, be a gyro vibrator device 9 shown in FIGS. 27 to 29. The gyro vibrator device 9 has a base 91, a pair of drive vibration arms 92 and 93, which extend from the base 91 toward the positive side of the direction Y and arranged side by side in the direction X, and a pair of detection vibration arms 94 and 95, which extend from the base 91 toward the negative side of the direction Y and arranged side by side in the direction X. When an angular velocity ωy around the axis Y acts on the thus configured gyro vibrator device 9 with the drive vibration arms 92 and 93 undergoing flexural vibration in the direction labeled with arrows SD in FIG. 27, the Coriolis force newly excites flexural vibration of the detection vibration arms 94 and 95 in the direction labeled with arrows SS, and the angular velocity ωy is detected based on the electric charges outputted from the detection vibration arms 94 and 95 due to the flexural vibration.

The drive vibration arms 92 and 93 have bottomed first grooves 921 and 931, which open via a first surface 9A, and bottomed second grooves 922 and 932, which open via a second surface 9B. The detection vibration arms 94 and 95 have bottomed first grooves 941 and 951, which open via the first surface 9A, and bottomed second grooves 942 and 952, which open via the second surface 9B. In the thus configured gyro vibrator device 9, the drive vibration arms 92 and 93 or the detection vibration arms 94 and 95 are regarded as the first and second vibrating arms.

What is claimed is:

1. A method for manufacturing a vibrator device including a first vibrating arm and a second vibrating arm extending along a first direction and arranged side by side along a second direction that intersects with the first direction, the first vibrating arm and the second vibrating arm each having a first surface and a second surface in a front-back relationship with the first surface and arranged side by side in a third direction that intersects with the first and second directions, a bottomed first groove that opens on the first surface, a bottomed second groove that opens on the second surface, and a side surface that connects the first surface and the second surface to each other, the method comprising:
a preparation step of preparing a quartz crystal substrate having the first surface and the second surface;
a first dry etching step of dry-etching the quartz crystal substrate from the first surface side to form the first grooves and part of outer shapes of the first vibrating arm and the second vibrating arm;
a second dry etching step of dry-etching the quartz crystal substrate from the second surface side to form the second grooves and part of the outer shapes of the first vibrating arm and the second vibrating arm; and
a wet etching step of wet-etching the side surfaces of the first and second vibrating arms.

2. The method for manufacturing a vibrator device according to claim 1,
wherein an amount by which the side surfaces are etched in the wet etching step is greater than or equal to 0.01 µm.

3. The method for manufacturing a vibrator device according to claim 1, wherein
an amount by which the side surfaces are etched in the wet etching step is smaller than or equal to 1 µm.

4. The method for manufacturing a vibrator device according to claim 1, wherein
an amount by which the side surfaces are etched in the wet etching step is smaller than or equal to 0.5 µm.

5. The method for manufacturing a vibrator device according to claim 1, wherein
in the wet etching step, the first surface and the second surface are masked.

6. The method for manufacturing a vibrator device according to claim 1, wherein
Wa/Aa<1 is satisfied in the first dry etching step,
where Wa represents a depth of the first grooves formed in the first dry etching step, and
Aa represents a depth of the outer shapes formed in the first dry etching step.

7. The method for manufacturing a vibrator device according to claim 1, wherein
Wa/Aa<1 is satisfied in the second dry etching step,
where Wa represents a depth of the second grooves formed in the second dry etching step, and
Aa represents a depth of the outer shapes formed in the second dry etching step.

8. The method for manufacturing a vibrator device according to claim 6, wherein
Wa/Aa≥0.2 is satisfied.

9. The method for manufacturing a vibrator device according to claim 7, wherein
Wa/Aa≥0.2 is satisfied.

\* \* \* \* \*